US009548240B2

(12) United States Patent
Lin et al.

(10) Patent No.: US 9,548,240 B2

(45) Date of Patent: Jan. 17, 2017

(54) SEMICONDUCTOR DEVICE AND METHOD OF FORMING REPASSIVATION LAYER FOR ROBUST LOW COST FAN-OUT SEMICONDUCTOR PACKAGE

(71) Applicant: STATS ChipPAC, Ltd., Singapore (SG)

(72) Inventors: Yaojian Lin, Singapore (SG); Kang Chen, Singapore (SG); Jianmin Fang, Singapore (SG); Xia Feng, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/616,942

(22) Filed: Feb. 9, 2015

(65) Prior Publication Data

US 2015/0155248 A1 Jun. 4, 2015

Related U.S. Application Data

(60) Continuation-in-part of application No. 14/284,752, filed on May 22, 2014, which is a continuation of (Continued)

(51) Int. Cl.

*H01L 23/00* (2006.01)
*H01L 21/768* (2006.01)
(Continued)

(52) U.S. Cl.

CPC ....... *H01L 21/76802* (2013.01); *H01L 21/563* (2013.01); *H01L 21/76879* (2013.01); (Continued)

(58) Field of Classification Search

CPC .... H01L 24/11; H01L 21/56; H01L 21/76802; H01L 24/06; H01L 23/28; H01L 2224/0401; H01L 2924/37001; H01L 23/49822; H01L 23/3192; H01L 24/96; H01L 21/76879; H01L 23/3114; H01L 23/49816; H01L 21/563; H01L 23/5389; H01L 24/19; H01L 24/82

See application file for complete search history.

(56) References Cited

U.S. PATENT DOCUMENTS

| | | | |
|---|---|---|---|
| 4,894,115 | A | 1/1990 | Eichelberger et al. |
| 5,157,001 | A | 10/1992 | Sakuma |

(Continued)

FOREIGN PATENT DOCUMENTS

| | | | |
|---|---|---|---|
| CN | 1246731 | A | 3/2000 |
| CN | 101138084 | A | 3/2008 |
| CN | 101752273 | A | 6/2010 |

*Primary Examiner* — Roy Potter

(74) *Attorney, Agent, or Firm* — Robert D. Atkins; Patent Law Group: Atkins and Associates, P.C.

(57) ABSTRACT

A semiconductor device comprises a semiconductor die including a conductive layer. A first insulating layer is formed over the semiconductor die and conductive layer. An encapsulant is disposed over the semiconductor die. A compliant island is formed over the first insulating layer. An interconnect structure is formed over the compliant island. An under bump metalization (UBM) is formed over the compliant island. The compliant island includes a diameter greater than 5 μm larger than a diameter of the UBM. An opening is formed in the compliant island over the conductive layer. A second insulating layer is formed over the first insulating layer and compliant island. A third insulating layer is formed over an interface between the semiconductor die and the encapsulant. An opening is formed in the third insulating layer over the encapsulant for stress relief.

25 Claims, 18 Drawing Sheets

242 242 242 242 236 230b 238 236 230c 232 230d 238 236 230e 232 236 230f 238 230g 230a 254 202 200 194 202 202 202 200 194 202 202 204 198 226 204 198

Related U.S. Application Data application No. 13/664,626, filed on Oct. 31, 2012, now Pat. No. 8,786,100, which is a division of application No. 12/724,367, filed on Mar. 15, 2010, now Pat. No. 8,343,809.

(51) Int. Cl.
*H01L 23/31* (2006.01)
*H01L 23/498* (2006.01)
*H01L 21/56* (2006.01)
*H01L 23/538* (2006.01)

(52) U.S. Cl.
CPC ...... *H01L 23/3114* (2013.01); *H01L 23/3192* (2013.01); *H01L 23/49816* (2013.01); *H01L 23/49822* (2013.01); *H01L 23/5389* (2013.01); *H01L 24/19* (2013.01); *H01L 24/82* (2013.01); *H01L 24/96* (2013.01); *H01L 21/568* (2013.01); *H01L 2223/5448* (2013.01); *H01L 2224/0401* (2013.01); *H01L 2224/04105* (2013.01); *H01L 2224/12105* (2013.01); *H01L 2224/48091* (2013.01); *H01L 2224/73265* (2013.01); *H01L 2224/94* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01032* (2013.01); *H01L 2924/01033* (2013.01); *H01L 2924/01047* (2013.01); *H01L 2924/01049* (2013.01); *H01L 2924/01073* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/10329* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/1815* (2013.01); *H01L 2924/18162* (2013.01); *H01L 2924/3511* (2013.01); *H01L 2924/37001* (2013.01)

(56) References Cited

U.S. PATENT DOCUMENTS 5,161,093 A 11/1992 Gorczyca et al.
5,250,843 A 10/1993 Eichelberger
5,353,498 A 10/1994 Fillion et al.
5,527,741 A 6/1996 Cole et al.
5,614,765 A 3/1997 Avanzino et al.
5,703,400 A 12/1997 Wojnarowski et al.
5,814,193 A 9/1998 Crowe
5,834,340 A 11/1998 Sawai et al.
5,841,193 A 11/1998 Eichelberger
5,866,952 A 2/1999 Wojnarowski et al.
6,025,995 A 2/2000 Marcinkiewicz
6,028,364 A 2/2000 Ogino et al.
6,110,773 A 8/2000 Lee
6,168,966 B1 1/2001 Fan et al.
6,187,615 B1 2/2001 Kim et al.
6,197,613 B1 3/2001 Kung et al.
6,271,469 B1 8/2001 Ma et al.
6,274,486 B1 8/2001 Rhodes et al.
6,423,571 B2 7/2002 Ogino et al.
7,008,822 B2 3/2006 Bolken et al.
7,165,316 B2 1/2007 Fjelstad
7,189,596 B1 3/2007 Mu et al.
7,192,807 B1 3/2007 Huemoeller et al.
7,329,563 B2 * 2/2008 Lo ...................... H01L 23/3114 257/E21.502
7,348,277 B2 3/2008 Koo et al.
7,569,427 B2 8/2009 Theuss
7,598,117 B2 10/2009 Kurita et al.
7,619,901 B2 11/2009 Eichelberger et al.
7,642,128 B1 1/2010 Lin et al.
7,657,157 B2 2/2010 Okabayashi et al.
7,666,709 B1 2/2010 Lin et al.
7,675,157 B2 3/2010 Liu et al.
7,767,496 B2 8/2010 Shim et al.
7,888,238 B2 2/2011 Wakisaka et al.
7,915,690 B2 3/2011 Shen
8,012,807 B2 9/2011 Meyer et al.
8,035,231 B2 10/2011 Kurita et al.
8,039,303 B2 10/2011 Shim et al.
8,097,489 B2 1/2012 Pagaila et al.
8,188,584 B1 5/2012 Berry et al.
8,193,647 B2 6/2012 Hsieh et al.
8,258,633 B2 9/2012 Sezi et al.
8,343,809 B2 1/2013 Lin et al.
8,786,100 B2 7/2014 Lin et al.
2003/0141105 A1 7/2003 Sugaya et al.
2004/0056344 A1 3/2004 Ogawa et al.
2004/0110316 A1 6/2004 Ogihara et al.
2005/0073029 A1 4/2005 Chua et al.
2005/0121771 A1 6/2005 Lin et al.
2006/0046347 A1 3/2006 Wood et al.
2006/0063312 A1 3/2006 Kurita
2006/0084240 A1 4/2006 Poo et al.
2007/0040258 A1 2/2007 Sheats
2007/0178622 A1 8/2007 Liu et al.
2007/0249153 A1 10/2007 Dong
2008/0006900 A1 1/2008 Chan et al.
2008/0012144 A1 1/2008 Meyer et al.
2008/0054426 A1 3/2008 Ohno et al.
2008/0090335 A1 4/2008 Morimoto et al.
2008/0188037 A1 8/2008 Lin
2008/0246126 A1 10/2008 Bowles et al.
2008/0265383 A1 10/2008 Brunnbauer et al.
2008/0313894 A1 12/2008 Fillion et al.
2009/0014869 A1 1/2009 Vrtis et al.
2009/0042366 A1 2/2009 Grivna
2009/0140442 A1 6/2009 Lin
2009/0146282 A1 6/2009 Tay et al.
2009/0152715 A1 6/2009 Shim et al.
2009/0309212 A1 12/2009 Shim et al.
2010/0258937 A1 10/2010 Shim et al.
2011/0095404 A1 4/2011 Yamano et al.
2011/0114950 A1 5/2011 Huang
2011/0198762 A1 8/2011 Scanlan
2011/0221055 A1 9/2011 Lin et al.
2011/0221057 A1 9/2011 Lin et al.
2011/0244657 A1 10/2011 Grivna et al.
2011/0254156 A1 10/2011 Lin
2011/0256690 A1 10/2011 Huang

* cited by examiner

SEMICONDUCTOR DEVICE AND METHOD OF FORMING REPASSIVATION LAYER FOR ROBUST LOW COST FAN-OUT SEMICONDUCTOR PACKAGE

CLAIM OF DOMESTIC PRIORITY

The present application is a continuation-in-part of U.S. patent application Ser. No. 14/284,752, filed May 22, 2014, which is a continuation of U.S. patent application Ser. No. 13/664,626, now U.S. Pat. No. 8,786,100, filed Oct. 31, 2012, which is a division of U.S. patent application Ser. No. 12/724,367, now U.S. Pat. No. 8,343,809, filed Mar. 15, 2010, which applications are incorporated herein by reference.

FIELD OF THE INVENTION

The present invention relates in general to semiconductor devices and, more particularly, to a semiconductor device and method of forming a dielectric layer to provide planarization at the interface between the semiconductor die and the encapsulant edge and a compliant island underneath the metal bump pad and the bumps.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation.

In most semiconductor devices, the semiconductor die are prone to shifting during encapsulation. The shift in position of the semiconductor die can cause the contact pad alignment to shift as much as ±20 micrometers (μm), particularly in fan-out wafer level chip scale packages (FO-WLCSP). The die shift limits the minimum achievable pitch due to potential misalignment between the contact pad and subsequent RDL. For example, a 50×50 μm opening over 60 μm contact pad with 20 μm via has only ±15 μm alignment tolerance, which is less than the potential die shift of ±20 μm. As a result, the FO-WLCSP often require metal deposition and patterning, which adds manufacturing cost. In addition, some semiconductor manufacturing equipment requires special alignment marks to achieve the necessary tolerances.

Many irregularities in the semiconductor manufacturing process can decrease board level reliability (BLR). For example, shorting between the metal lines and the metal routing layers can occur due to cutting irregularities along the saw street, such as metal peeling, during wafer singulation. Shorting may also be due to laser grooving recast issues during wafer singulation. Shorting reduces BLR. Another BLR concern is early failure at the interface between the bumps and the encapsulant in embedded wafer level ball grid array (eWLB) packages, due to die standoff at the boundary or interface between the semiconductor die and the encapsulant.

SUMMARY OF THE INVENTION

A need exists to improve BLR by mitigating the problems caused by cutting irregularities along the saw street, such as metal peeling, during wafer singulation, and die standoff at the boundary or interface between the semiconductor die and the encapsulant. Accordingly, in one embodiment, the present invention is a method of making a semiconductor device comprising the steps of providing a first semiconductor die including a conductive layer, forming a first insulating layer over the first semiconductor die and conductive layer, and disposing an encapsulant over the first semiconductor die. The method further includes the steps of forming a second insulating over the encapsulant and first insulating layer, removing a portion of the second insulating layer to leave a compliant island, and forming an interconnect structure over the compliant island.

In another embodiment, the present invention is a method of making a semiconductor device comprising the steps of providing a first semiconductor die, forming a first insulating layer over the first semiconductor die, disposing an encapsulant over the first semiconductor die, and forming a compliant island over the encapsulant and first insulating layer.

In another embodiment, the present invention is a semiconductor device comprising a semiconductor die including a conductive layer. A first insulating layer is formed over the semiconductor die and conductive layer. An encapsulant is disposed over the semiconductor die. A compliant island is formed over the first insulating layer. An interconnect structure is formed over the compliant island.

In another embodiment, the present invention is a semiconductor device comprising a semiconductor die. A first insulating layer is formed over the semiconductor die. A compliant island is formed over the first insulating layer.

DETAILED DESCRIPTION OF THE DRAWINGS

Figure 1:
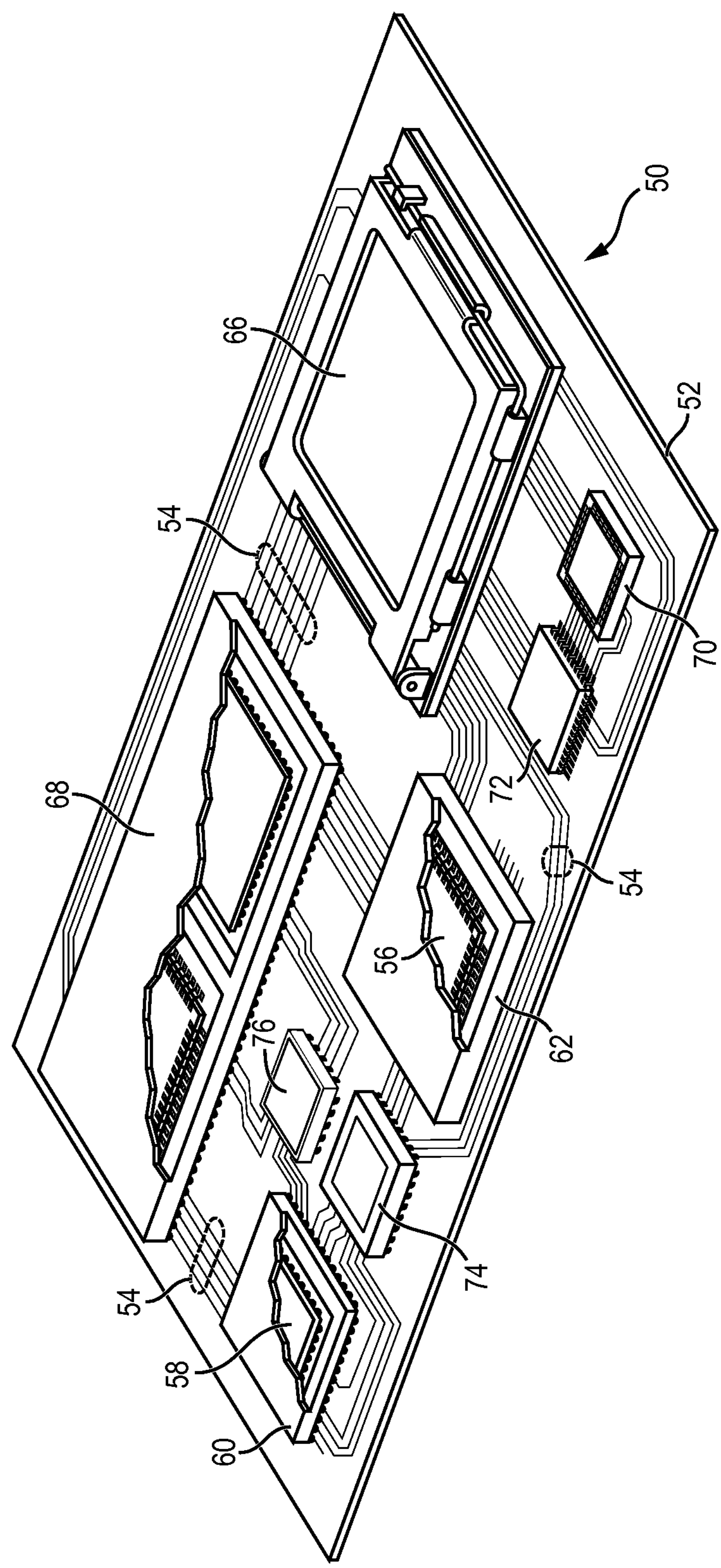
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, eWLB 74, and wafer level chip scale package (WLCSP) 76 are shown mounted on PCB 52. In one embodiment, eWLB 74 is a fan-out wafer level package (FO-WLP) and WLCSP 76 is a fan-in wafer level package (FI-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
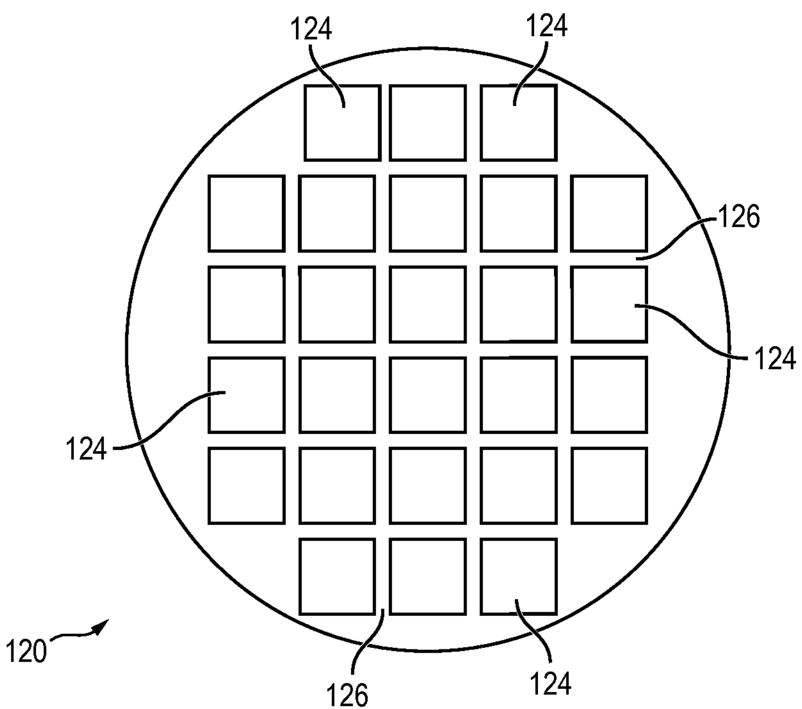
FIGS. 2*a*-2*o* illustrate a process of forming a repassivation layer over the semiconductor die with a reduced opening to the contact pad.
Figure 2B:
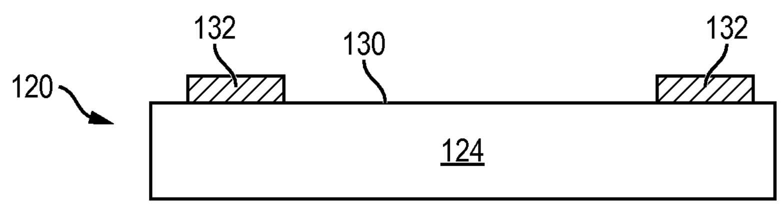
Figure 2C:
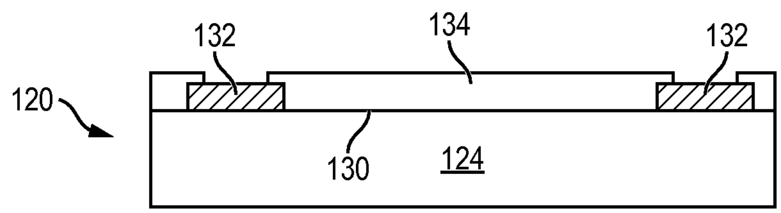
Figure 2D:
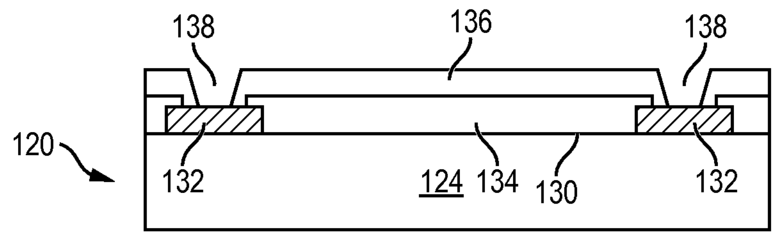
Figure 2E:
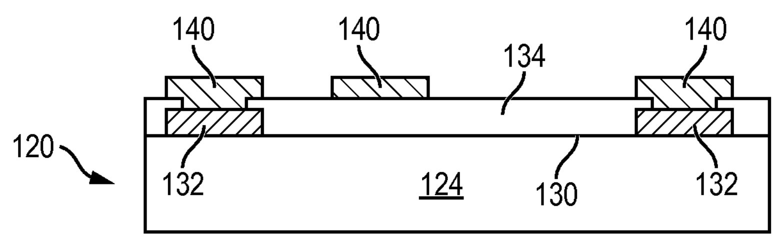
Figure 2F:
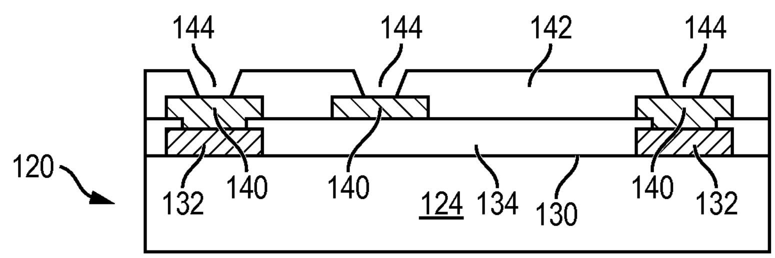
Figure 2G:
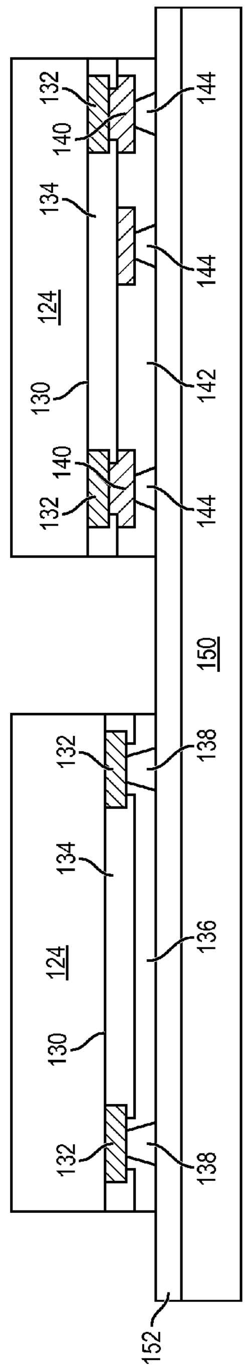
Figure 2H:
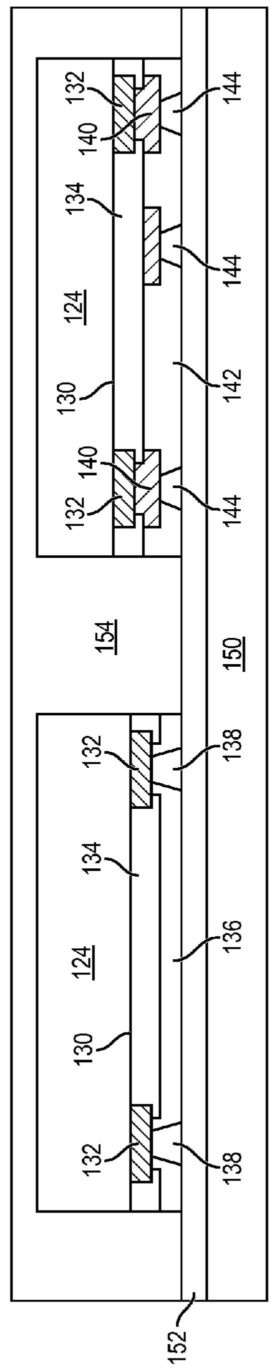
Figure 2I:
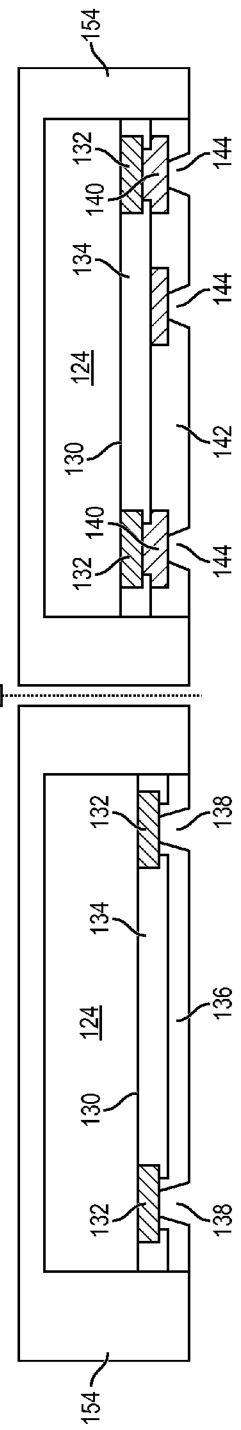
Figure 2J:
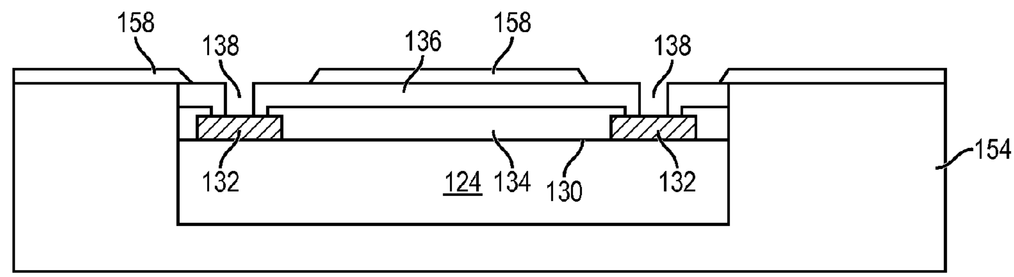
Figure 2K:
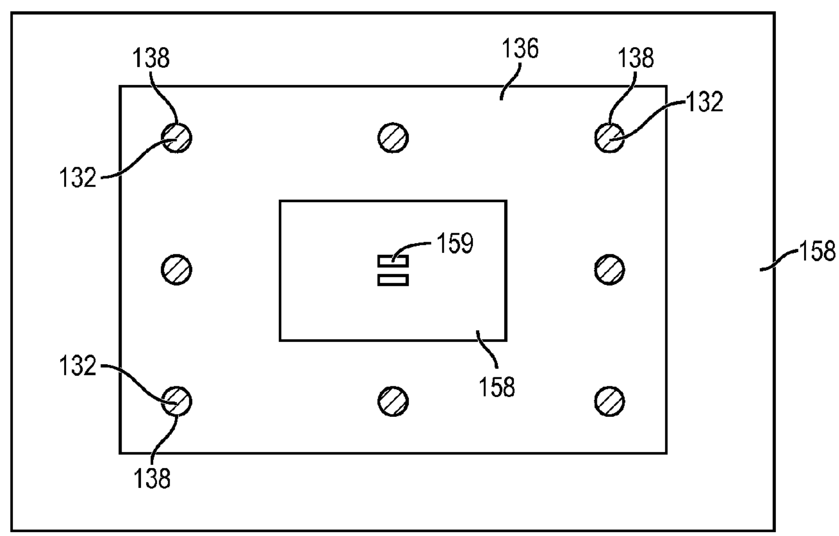
Figure 2L:
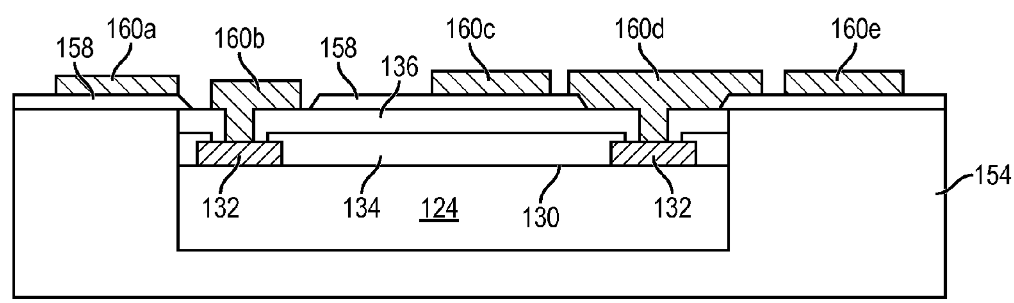
Figure 2M:
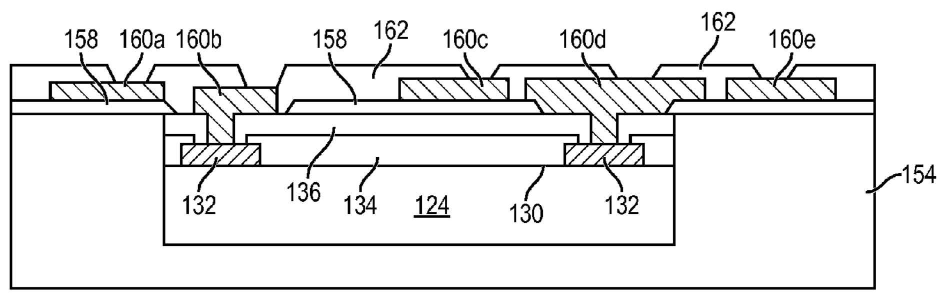
Figure 2N:
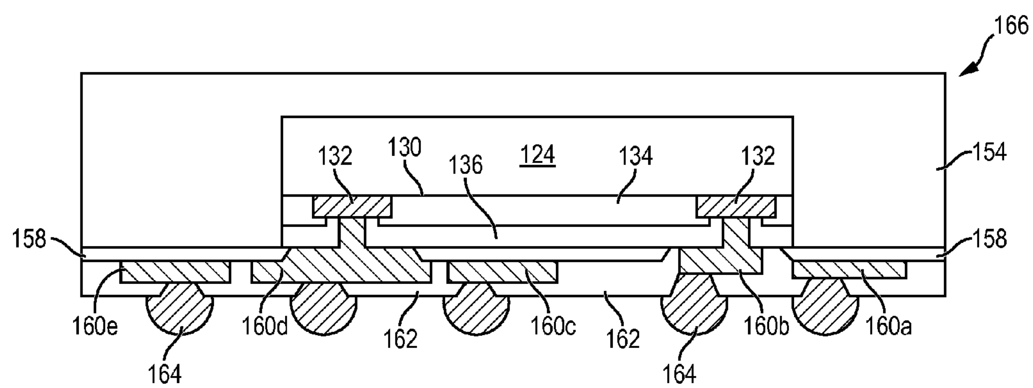
Figure 2O:
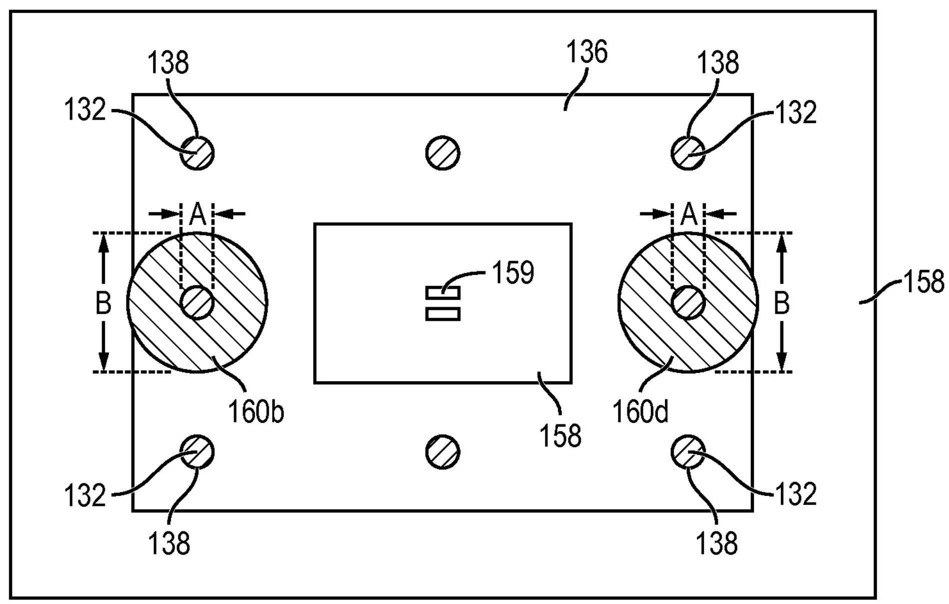

FIGS. 2*a*-2*o* illustrate, in relation to FIG. 1, a process of forming a repassivation layer over the semiconductor die with a reduced opening to the contact pad for better RDL alignment tolerance. FIG. 2*a* shows a semiconductor wafer 120 with a base substrate material, such as silicon, germanium, gallium arsenide, indium phosphide, or silicon carbide, for structural support. A plurality of semiconductor die or components 124 is formed on wafer 120 separated by saw streets 126 as described above.

FIG. 2*b* shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130.

In FIG. 2*c*, an insulating or dielectric layer 134 is formed over active surface 130 and contact pads 132 using PVD, CVD, printing, spin coating, spray coating, or thermal oxidation. The insulating layer 134 can be one or more layers of silicon dioxide (SiO2), silicon nitride (Si2n4), silicon oxynitride (SiON), tantalum pentoxide (Ta2O5), aluminum oxide (Al2O3), polyimide, benzocyclobutene (BCB), polybenzoxazoles (PBO), or other suitable dielectric material. A portion of insulating layer 134 is removed by an etching process to form an opening and expose contact pads 132.

In FIG. 2*d*, a repassivation insulating layer 136 is formed over insulating layer 134 and contact pads 132 by PVD, CVD, printing, spin coating, spray coating, or thermal oxidation. The repassivation insulating layer 136 can be one or more layers of SiO2, Si2n4, SiON, Ta2O5, Al2O3, polyimide, PBO, polymer dielectric, or other material having similar insulating and structural properties. A portion of repassivation insulating layer 136 is removed by an etching process to form via 138 and expose an inside portion of contact pads 132, i.e., a portion of the contact pad within its footprint. Via 138 is formed within the opening of insulating layer 134. Via 138 is at least 10 micrometers smaller than the opening of insulating layer 134.

In another embodiment, continuing from FIG. 2*c*, an electrically conductive layer 140 is formed over insulating layer 134 and conductive layer 132 using PVD, CVD, electrolytic plating, electroless plating process, or other suitable metal deposition process, as shown in FIG. 2*e*. Conductive layer 140 can be one or more layers of Al, Cu, Sn, Ni, Au, Ag, or other suitable electrically conductive material.

In FIG. 2*f*, a repassivation insulating layer 142 is formed over insulating layer 134 and conductive layer 140 by PVD, CVD, printing, spin coating, spray coating, or thermal oxidation. The repassivation insulating layer 142 can be one or more layers of SiO2, Si2n4, SiON, Ta2O5, Al2O3, polyimide, PBO, polymer dielectric, or other material having similar insulating and structural properties. A portion of repassivation insulating layer 142 is removed by an etching process to form via 144 and expose an inside portion of conductive layer 140, i.e., a portion of the conductive layer within its footprint. Via 144 is formed within the opening of insulating layer 134. Via 144 is at least 10 micrometers smaller than the opening of insulating layer 134.

In FIG. 2*g*, a temporary substrate or carrier 150 contains temporary or sacrificial base material such as silicon, polymer, polymer composite, metal, ceramic, glass, glass epoxy, beryllium oxide, or other suitable low-cost, rigid material for structural support. An interface layer or tape 152 is applied over carrier 150 as a temporary adhesive bonding film or etch-stop layer. Semiconductor wafer 120 is singulated through saw streets 126 using a laser cutting tool or saw blade. Semiconductor die 124 are mounted to interface layer 152 over carrier 150 using pick and place operation. For the purpose of illustration, a semiconductor die 124 with repassivation insulating layer 136 from FIG. 2*d*, and semiconductor die 124 with conductive layer 140 and repassivation insulating layer 142 from FIG. 2*f*, are mounted to carrier 150 with vias 138 and 144 oriented to interface layer 152.

In FIG. 2*h*, an encapsulant or molding compound 154 is deposited over semiconductor die 124 and carrier 150 using a paste printing, compressive molding, transfer molding, liquid encapsulant molding, vacuum lamination, spin coating, or other suitable applicator. Encapsulant 154 can be polymer composite material, such as epoxy resin with filler, epoxy acrylate with filler, or polymer with proper filler. Encapsulant 154 is then thermal cured to a solid form. Encapsulant 154 is non-conductive and environmentally protects the semiconductor device from external elements and contaminants.

In FIG. 2*i*, the temporary carrier 150 and interface layer 152 are removed by chemical etching, mechanical peel-off, CMP, mechanical grinding, thermal bake, ultra-violet (UV) light, laser scanning, or wet stripping. Semiconductor die 124 are singulated using a laser cutting tool or saw blade 156.

In FIG. 2*j*, an insulating or dielectric layer 158 is formed over repassivation insulating layer 136 and encapsulant 154 of the singulated semiconductor die 124 by PVD, CVD, screen printing, spin coating, spray coating, lamination, or thermal oxidation. The insulating layer 158 can be one or more layers of SiO2, Si2n4, SiON, Ta2O5, Al2O3, or other material having similar dielectric properties. A portion of insulating layer 158 is removed by an etching process to expose repassivation insulating layer 136 and contact pads 132. The opening of insulating layer 158 can be round vias, trenches, or rings, but in any case the opening is larger than vias 138 for alignment purposes. In one embodiment, the opening of insulating layer 158 extends at least 25 μm in each direction beyond vias 138.

FIG. 2*k* shows a bottom view of insulating layer 158 and repassivation insulating layer 136 over semiconductor die 124 and encapsulant 154. Vias 138 are formed inside the footprint of contact pads 132 and extend down to the contact pads. An optional alignment mark 159 can be used for various manufacturing equipment.

In FIG. 2*l*, an electrically conductive layer 160 is formed over repassivation insulating layer 136 and insulating layer 158 and into vias 138 to contact pads 132 using PVD, CVD, electrolytic plating, electroless plating process, or other suitable metal deposition process to form individual portions or sections 160*a*-160*e*. Conductive layer 160 can be one or more layers of Al, Cu, Sn, Ni, Au, Ag, or other suitable electrically conductive material. The individual portions of conductive layer 160*a*-160*e* can be electrically common or electrically isolated depending on the connectivity of the individual semiconductor die. Conductive layer 160*b* and 160*d* is electrically connected to contact pads 132 and operates as a redistribution layer (RDL) to extend the connectivity of the contact pads. Conductive layer 160 can be formed inside the opening in insulating layer 158 (see conductive layer 160*b*) or outside the opening in insulating layer 158 (see conductive layer 160*d*).

In FIG. 2*m*, an insulating or dielectric layer 162 is formed over insulating layer 158 and RDL 160 by PVD, CVD, screen printing, spin coating, spray coating, lamination, or thermal oxidation. The insulating layer 162 can be one or more layers of SiO2, Si2n4, SiON, Ta2O5, Al2O3, or other material having similar dielectric properties. A portion of insulating layer 162 is removed by an etching process to expose RDL 160.

In FIG. 2*n*, an electrically conductive bump material is deposited over RDL 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to RDL 160 using a suitable attachment or bonding process. In one embodiment, the bump material is reflowed by heating the material above its melting point to form spherical balls or bumps 164. In some applications, bumps 164 are reflowed a second time to improve electrical contact to RDL 160. The bumps can also be compression bonded to RDL 160. Bumps 164 represent one type of interconnect structure that can be formed over RDL 160. The interconnect structure can also use bond wires, stud bump, micro bump, or other electrical interconnect.

In FO-WLCSP 166 of FIG. 2*n*, semiconductor die 124 is electrically connected through contact pads 132, RDL 160, and bumps 164 to external electrical components. The repassivation insulating layer 136 in FIG. 2*d* and repassivation insulating layer 142 in FIG. 2*f* can be polymer dielectric material, such as polyimide, PBO, BCB, or repassivation inorganic dielectric, such as Si2n4, SiON, and SiO2. Vias 138 and 144 are formed through repassivation insulating layer 136 and repassivation insulating layer 142, respectively, inside the footprint of contact pads 132. FO-WLCSP 166 uses vias 138 and 144 in repassivation insulating layers 136 and 142 to reduce the opening to contact pads 132 which improves alignment tolerance with RDL 160. In one embodiment, vias 138 and 144 are 20 μm in width or diameter, and at least 10 micrometers smaller than the opening of insulating layer 134, shown as dimension A in FIG. 2*o*. RDL 160*d* has a width or diameter of 60 μm, shown as dimension B in FIG. 2*o*. The RDL alignment tolerance is thus ±20 μm with the 20 μm via 138 and 60 μm contact area for RDL 160*b* and 160*d*, which is within a typical die shift tolerance. In general, RDL 160 has at least 12 micrometer per side alignment tolerance with vias 138 and 144. The repassivation insulating layers 136 and 142 improve yield for FO-WLCSP with lower cost since only lithography and thermal curing are needed. The repassivation insulating layers 136 and 142 also planarize the surface of semiconductor die 124 for better adhesion to carrier 150 which reduces the potential shifting of semiconductor die 124. The insulating layer 136 has equal or better resolution as insulating layer 158. The repassivation insulating layers 136 and 142 can extend to saw street 126 to suppress cutting irregularities along the saw street, such as metal peeling, during wafer singulation. A double saw cut can be used instead of high cost laser cutting.

Figure 3:
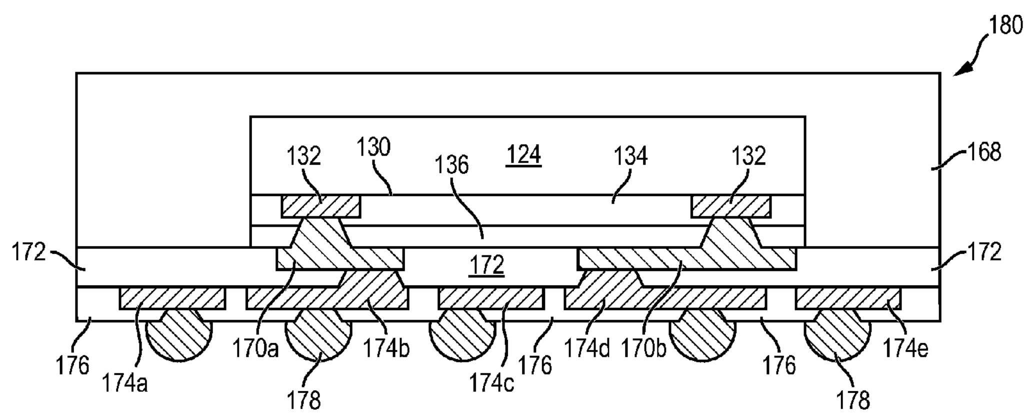
FIG. 3 illustrates another process of forming a repassivation layer over the semiconductor die to reduce an opening to the contact pad.

In another embodiment, continuing from FIG. 2*i*, an electrically conductive layer 170 is formed over repassivation insulating layer 136 and into vias 138 to contact pads 132 using PVD, CVD, electrolytic plating, electroless plating process, or other suitable metal deposition process to form individual portions or sections 170*a*-170*b*, see FIG. 3. Conductive layer 170 can be one or more layers of Al, Cu, Sn, Ni, Au, Ag, or other suitable electrically conductive material. The individual portions of conductive layer 170*a* and 170*b* can be electrically common or electrically isolated depending on the connectivity of the individual semiconductor die. Conductive layer 170*a* and 170*b* is electrically connected to contact pads 132 and operates as an RDL to extend the connectivity of the contact pads.

An insulating or dielectric layer 172 is formed over repassivation insulating layer 136 and RDL 170 by PVD, CVD, screen printing, spin coating, spray coating, lamination, or thermal oxidation. The insulating layer 172 can be one or more layers of SiO2, Si2n4, SiON, Ta2O5, Al2O3, or other material having similar dielectric properties. A portion of insulating layer 172 is removed by an etching process to expose RDL 170.

An electrically conductive layer 174 is formed over insulating layer 172 and RDL 170 using PVD, CVD, electrolytic plating, electroless plating process, or other suitable metal deposition process to form individual portions or sections 174*a*-174*e*. Conductive layer 174 can be one or more layers of Al, Cu, Sn, Ni, Au, Ag, or other suitable electrically conductive material. The individual portions of conductive layer 174*a*-174*e* can be electrically common or electrically isolated depending on the connectivity of the individual semiconductor die. Conductive layer 174*b* and 174*d* are electrically connected to RDL 170*a* and 170*b*, respectively, and operates as an RDL to extend the connectivity.

An insulating or dielectric layer 176 is formed over insulating layer 172 and RDL 174 by PVD, CVD, screen printing, spin coating, spray coating, lamination, or thermal oxidation. The insulating layer 176 can be one or more layers of SiO2, Si2n4, SiON, Ta2O5, Al2O3, or other material having similar dielectric properties. A portion of insulating layer 176 is removed by an etching process to expose RDL 174.

An electrically conductive bump material is deposited over RDL 174 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to RDL 174 using a suitable attachment or bonding process. In one embodiment, the bump material is reflowed by heating the material above its melting point to form spherical balls or bumps 178. In some applications, bumps 178 are reflowed a second time to improve electrical contact to RDL 174. The bumps can also be compression bonded to RDL 174. Bumps 178 represent one type of interconnect structure that can be formed over RDL 174. The interconnect structure can also use bond wires, stud bump, micro bump, or other electrical interconnect.

In FO-WLCSP 180 of FIG. 3, semiconductor die 124 is electrically connected through contact pads 132, RDLs 170 and 174, and bumps 178 to external electrical components. The repassivation insulating layer 136 can be polymer dielectric material, such as polyimide, PBO, BCB, or repassivation inorganic dielectric, such as Si2n4, SiON, and SiO2. Vias 138 are formed through repassivation insulating layer 136 inside the footprint of contact pads 132. FO-WLCSP 180 uses vias 138 in repassivation insulating layer 136 to reduce the opening to contact pads 132 which improves alignment tolerance with RDL 170. In one embodiment, vias 138 are 20 μm in width or diameter, and at least 10 micrometers smaller than the opening of insulating layer 134. RDL 170*a* and 170*b* has a width or diameter of 60 μm. The RDL alignment tolerance is thus ±20 μm with the 20 μm via 138 and 60 μm contact area for RDL 170*a* and 170*b*, which is within a typical die shift tolerance. In general, RDL 170 has at least 12 micrometer per side alignment tolerance with vias 138. The repassivation insulating layers 136 improve yield for FO-WLCSP with lower cost since only lithography and thermal curing are needed. The repassivation insulating layers 136 also planarize the surface of semiconductor die 124 for better adhesion to the temporary carrier which reduces the potential shifting of semiconductor die 124. The repassivation insulating layers 136 can extend to saw street 126 to suppress cutting irregularities along the saw street, such as metal peeling, during wafer singulation. A double saw cut can be used instead of high cost laser cutting.

Figure 4A:
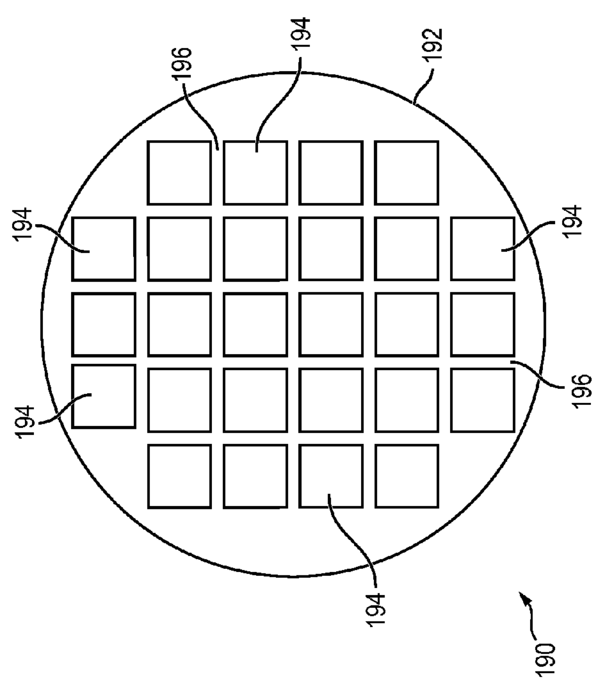
FIGS. 4*a*-4*d* illustrate a semiconductor wafer with a plurality of semiconductor die separated by a saw street.

FIG. 4*a* shows a semiconductor wafer 190 with a base substrate material 192, such as silicon, germanium, aluminum phosphide, aluminum arsenide, gallium arsenide, gallium nitride, indium phosphide, silicon carbide, or other bulk semiconductor material for structural support. A plurality of semiconductor die or components 194 is formed on wafer 190 separated by a non-active, inter-die wafer area or saw street 196 as described above. Saw street 196 provides cutting areas to singulate semiconductor wafer 190 into individual semiconductor die 194. In one embodiment, semiconductor wafer 190 has a width or diameter of 100-450 millimeters (mm).

Figure 4B:
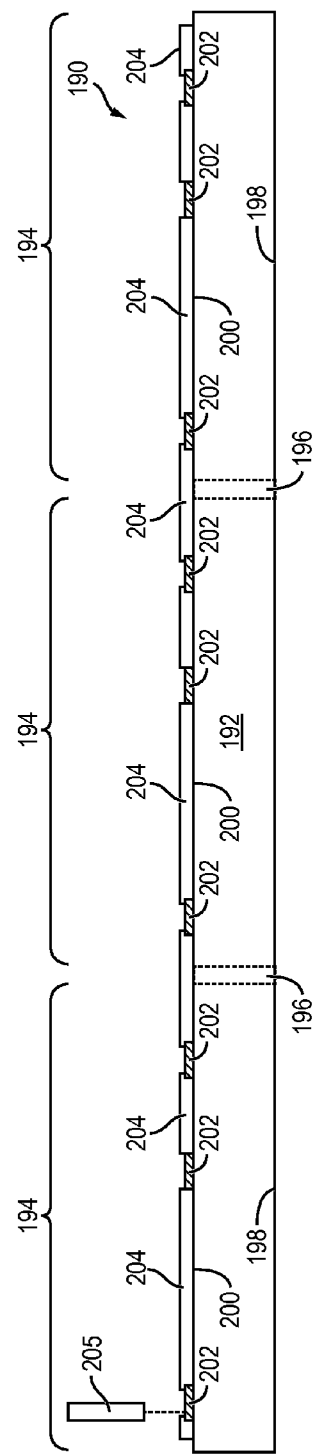

FIG. 4*b* shows a cross-sectional view of a portion of semiconductor wafer 190. Each semiconductor die 194 has a back or non-active surface 198 and an active surface 200 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 200 to implement analog circuits or digital circuits, such as DSP, ASIC, MEMS, memory, or other signal processing circuit. In one embodiment, active region 200 contains a MEMS, such as an accelerometer, strain gauge, microphone, or other sensor responsive to various external stimuli. Semiconductor die 194 may also contain IPDs, such as inductors, capacitors, and resistors, for RF signal processing.

An electrically conductive layer 202 is formed over active surface 200 using PVD, CVD, electrolytic plating, electroless plating process, or other suitable metal deposition process. Conductive layer 202 can be one or more layers of Al, Cu, Sn, Ni, Au, Ag, or other suitable electrically conductive material. Conductive layer 202 operates as contact pads electrically connected to the circuits on active surface 200. Conductive layer 202 can be formed as contact pads disposed side-by-side a first distance from the edge of semiconductor die 194. Alternatively, conductive layer 202 can be formed as contact pads that are offset in multiple rows such that a first row of contact pads is disposed a first distance from the edge of the die, and a second row of contact pads alternating with the first row is disposed a second distance from the edge of the die. Conductive layer 202 has sufficient thickness to provide vertical offset for electrical interconnect.

An insulating or passivation layer 204 is formed over active surface 200 and conductive layer 202 using PVD, CVD, printing, spin coating, spray coating, sintering or thermal oxidation. Insulating layer 204 contains one or more layers of SiO2, Si3N4, SiON, Ta2O5, Al2O3, low temperature (<250° C.) curable polymer, or other material having similar structural and insulating properties. A portion of insulating layer 204 is removed by an exposure or development process, laser direct ablation (LDA) using laser 205, etching, or other suitable method to expose conductive layer 202.

Semiconductor wafer 190 undergoes electrical testing and inspection as part of a quality control process. Manual visual inspection and automated optical systems are used to perform inspections on semiconductor wafer 190. Software can be used in the automated optical analysis of semiconductor wafer 190. Visual inspection methods may employ equipment such as a scanning electron microscope, high-intensity or ultra-violet light, or metallurgical microscope. Semiconductor wafer 190 is inspected for structural characteristics including warpage, thickness variation, surface particulates, irregularities, cracks, delamination, and discoloration.

Figure 4C:
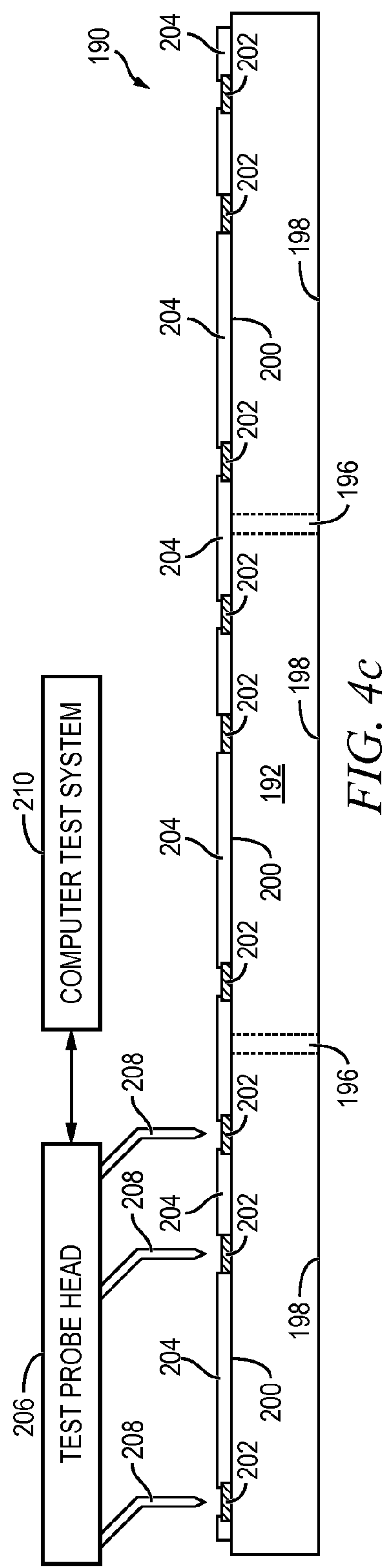

The active and passive components within semiconductor die 194 undergo testing at the wafer level for electrical performance and circuit function. Each semiconductor die 194 is tested for functionality and electrical parameters, as shown in FIG. 4*c*, using a test probe head 206 including a plurality of probes or test leads 208, or other testing device. Probes 208 are used to make electrical contact with nodes or conductive layer 202 on each semiconductor die 194 and provide electrical stimuli to contact pads 202. Semiconductor die 194 responds to the electrical stimuli, which is measured by computer test system 210 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 190 enables semiconductor die 194 that pass to be designated as known good die (KGD) for use in a semiconductor package.

Figure 4D:
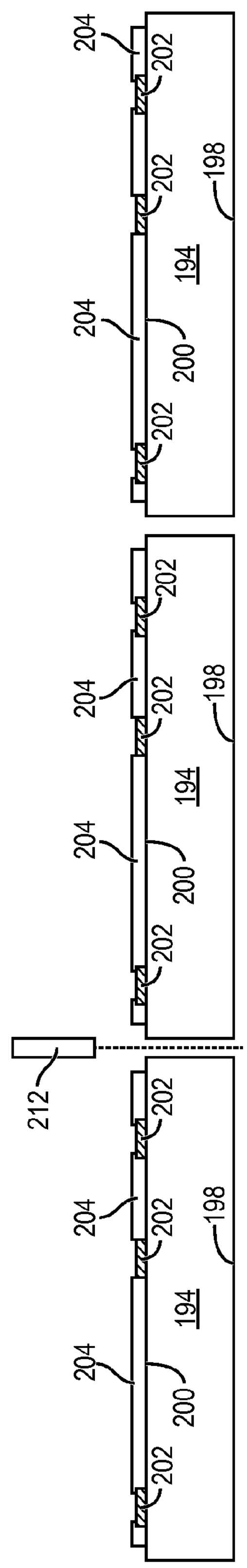

In FIG. 4*d*, semiconductor wafer 190 is singulated through saw street 196 using a saw blade or laser cutting tool 212 into individual semiconductor die 194. The individual semiconductor die 194 can be inspected and electrically tested for identification of KGD post singulation.

Figure 5A:
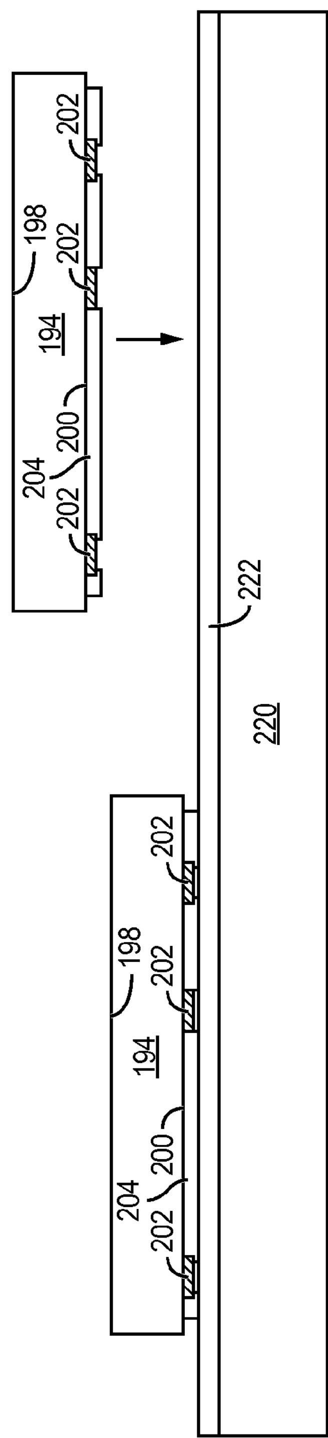
FIGS. 5*a*-5*k* illustrate a process of forming a repassivation layer over the semiconductor die and the interface between the semiconductor die and the encapsulant to provide a robust low cost fan-out semiconductor package.

FIGS. 5*a*-5*k* illustrate, in relation to FIGS. 1 and 2*a*-2*o*, a process of forming a semiconductor package including a dielectric layer to provide both planarization at the interface between the semiconductor die and the encapsulant edge and compliant islands underneath the metal bump pads and the bumps. FIG. 5*a* shows a cross-sectional view of a portion of a carrier or temporary substrate 220 containing sacrificial base material such as silicon, polymer, beryllium oxide, glass, or other suitable low-cost, rigid material for structural support. An interface layer or double-sided tape 222 is formed over carrier 220 as a temporary adhesive bonding film, etch-stop layer, or thermal release layer.

Carrier 220 can be a round or rectangular panel (greater than 300 millimeters) with capacity for multiple semiconductor die 194. Carrier 220 may have a larger surface area than the surface area of semiconductor wafer 190. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 220 is selected independent of the size of semiconductor die 194 or size of semiconductor wafer 190. That is, carrier 220 has a fixed or standardized size, which can accommodate various size semiconductor die 194 singulated from one or more semiconductor wafers 190. In one embodiment, carrier 220 is circular with a diameter of 330 mm. In another embodiment, carrier 220 is rectangular with a width of 560 mm and length of 600 mm. Semiconductor die 194 may have dimensions of 10 mm by 10 mm, which are placed on the standardized carrier 220. Alternatively, semiconductor die 194 may have dimensions of 20 mm by 20 mm, which are placed on the same standardized carrier 220. Accordingly, standardized carrier 220 can handle any size semiconductor die 194, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 220 lowers manufacturing costs and capital risk by reducing or eliminating the need for specialized semiconductor processing lines based on die size or incoming wafer size. By selecting a predetermined carrier size to use for any size semiconductor die from all semiconductor wafer sizes, a flexible manufacturing line can be implemented.

Figure 5B:
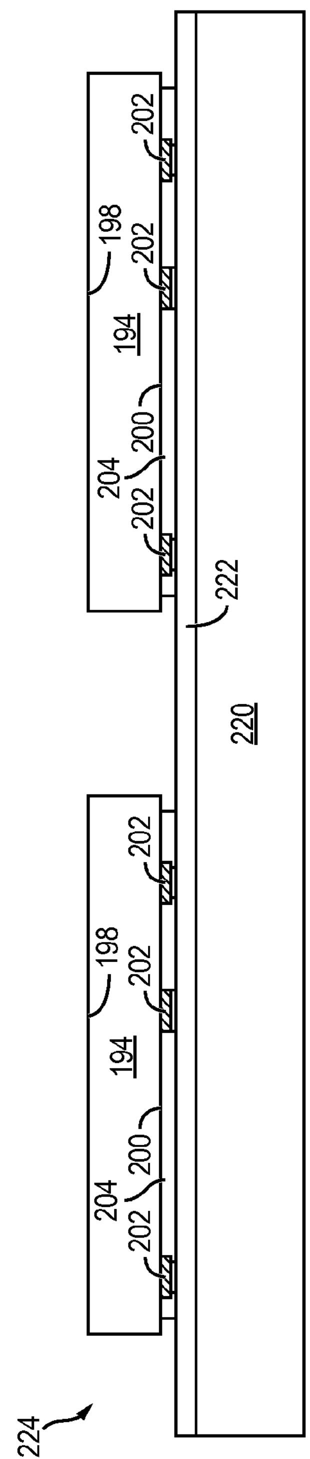

In FIG. 5*a*, semiconductor die 194 from FIG. 4*d* are mounted to carrier 220 and foil layer 222 using, for example, a pick and place operation, with active surface 200 oriented toward the carrier. FIG. 5*b* shows semiconductor die 194 mounted to foil layer 222 of carrier 220 as reconstituted or reconfigured wafer 224.

Reconstituted wafer 224 can be processed into many types of semiconductor packages, including eWLB, FI-WLCSP, reconstituted or embedded wafer level chip scale packages (eWLCSP), FO-WLCSP, flipchip packages, three dimensional (3D) packages, such as package-on-package (PoP), or other semiconductor packages. Reconstituted wafer 224 is configured according to the specifications of the resulting semiconductor package. In one embodiment, semiconductor die 194 are placed on carrier 220 in a high-density arrangement, i.e., 300 micrometers (μm) apart or less, for processing fan-in devices. In another embodiment, semiconductor die 194 are separated by a distance of 50 μm on carrier 220. The distance between semiconductor die 194 on carrier 220 is optimized for manufacturing the semiconductor packages at the lowest unit cost. The larger surface area of carrier 220 accommodates more semiconductor die 194 and lowers manufacturing cost as more semiconductor die 194 are processed per reconstituted wafer 224. The number of semiconductor die 194 mounted to carrier 220 can be greater than the number of semiconductor die 194 singulated from semiconductor wafer 190. Carrier 220 and reconstituted wafer 224 provide the flexibility to manufacture many different types of semiconductor packages using different size semiconductor die 194 from different sized semiconductor wafers 190.

Figure 5C:
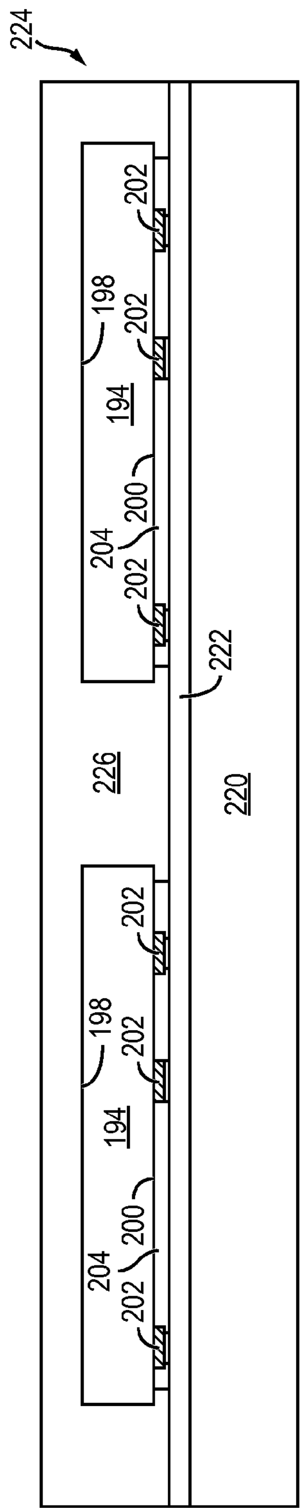
Figure 5D:
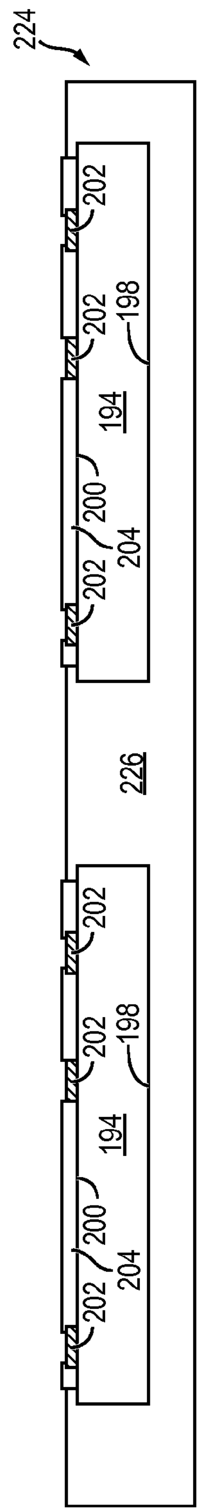

In FIG. 5*c*, an encapsulant or molding compound 226 is deposited over semiconductor die 194 and carrier 220 as an insulating material using a paste printing, compressive molding, transfer molding, liquid encapsulant molding, vacuum lamination, spin coating, or other suitable applicator. In particular, encapsulant 226 covers the side surfaces and back surface 198 of semiconductor die 194. Encapsulant 226 can be polymer composite material, such as epoxy resin with filler, epoxy acrylate with filler, or polymer with proper filler. Encapsulant 226 is non-conductive, provides physical support, and environmentally protects the semiconductor device from external elements and contaminants. In one embodiment, encapsulant 226 is deposited using film-assisted molding process.

In 5*d*, carrier 220 and interface layer 222 are removed by chemical etching, mechanical peeling, CMP, mechanical grinding, thermal bake, UV light, laser scanning, or wet stripping to expose conductive layer 202 and insulating layer 204 over active surface 200 of semiconductor die 194.

Figure 5E:
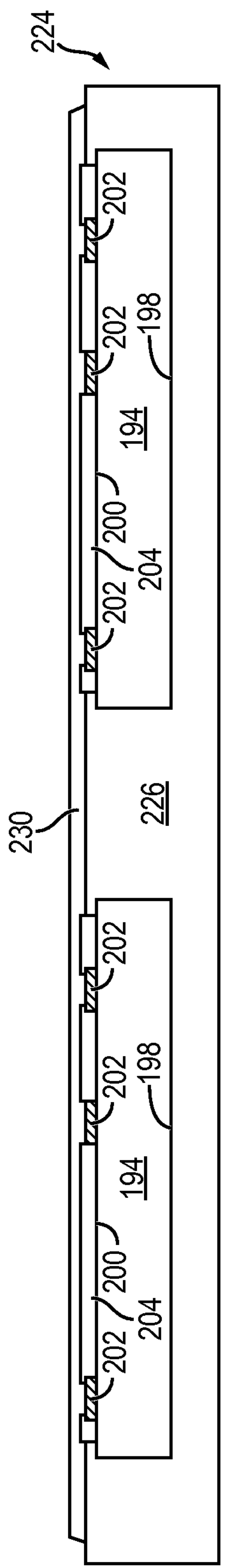

In FIG. 5*e*, insulating or passivation layer 230 is formed over encapsulant 226, insulating layer 204, and conductive layer 202 using PVD, CVD, printing, spin coating, spray coating, sintering or thermal oxidation. Insulating layer 230 contains one or more layers of SiO2, Si3N4, SiON, Ta2O5, Al2O3, low temperature (<250° C.) curable polymer, or other material having similar structural and insulating properties. Passivation layer 230 is coated over the fan-out substrate before a typical first dielectric layer to provide planarization at the interface between semiconductor die 194 and encapsulant 226. Passivation layer 230 helps prevent dishing at the center of active surface 200 of semiconductor die 194.

Figure 5F:
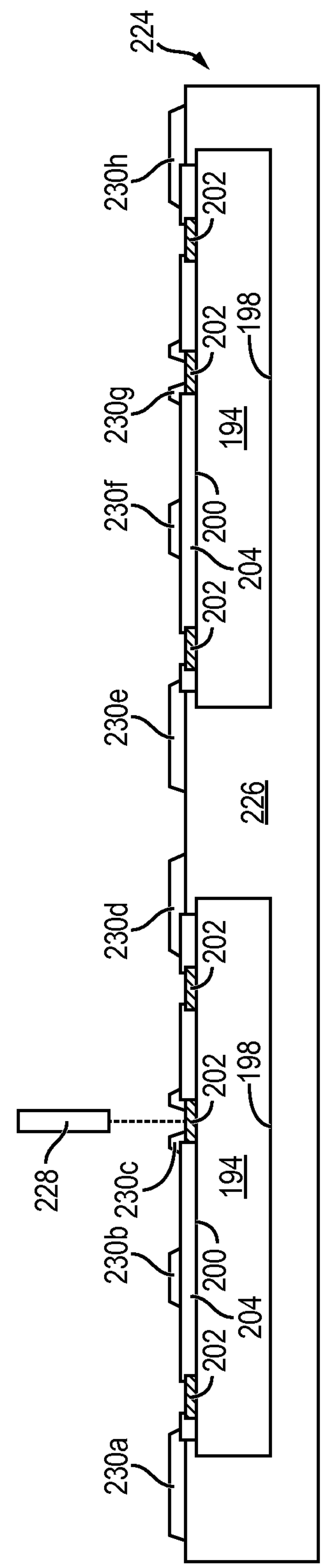

In FIG. 5*f*, portions of passivation layer 230 are removed by an exposure or development process, laser direct ablation (LDA) using laser 228, etching, or other suitable method to form compliant islands 230*a*-230*h*, generically, 230*n*. Compliant islands 230*a*, 230*d*, 230*e*, and 230*h* planarize the interface between the edge of semiconductor die 194 and encapsulant 226 to reduce standoff of semiconductor die 194. In one embodiment, compliant islands 230*a*, 230*d*, 230*e*, and 230*h* extend beyond the edge of semiconductor die 194 at least 20 μm over encapsulant 226. Compliant islands 230*a*, 230*d*, 230*e*, and 230*h* provide initial coverage over metal burrs and laser grooving recast to allow sufficient process margin and avoid shorting between metal layers formed near the edge of semiconductor die 194. Compliant islands 230*b*, 230*c*, 230*f*, and 230*g* prevent dishing at the center of semiconductor die 194. Compliant islands 230*a*-230*h* are positioned to provide compliant islands under interconnect structures, including bumps, to be formed later, as described below. In one embodiment, compliant islands 230*a*-230*h* are 5 μm larger in diameter than under bump metalization to be formed later, as described below. A portion of compliant islands 230*c* and 230*g* is removed by an exposure or development process, LDA using laser 228, etching, or other suitable method to expose conductive layer 202.

Figure 5G:
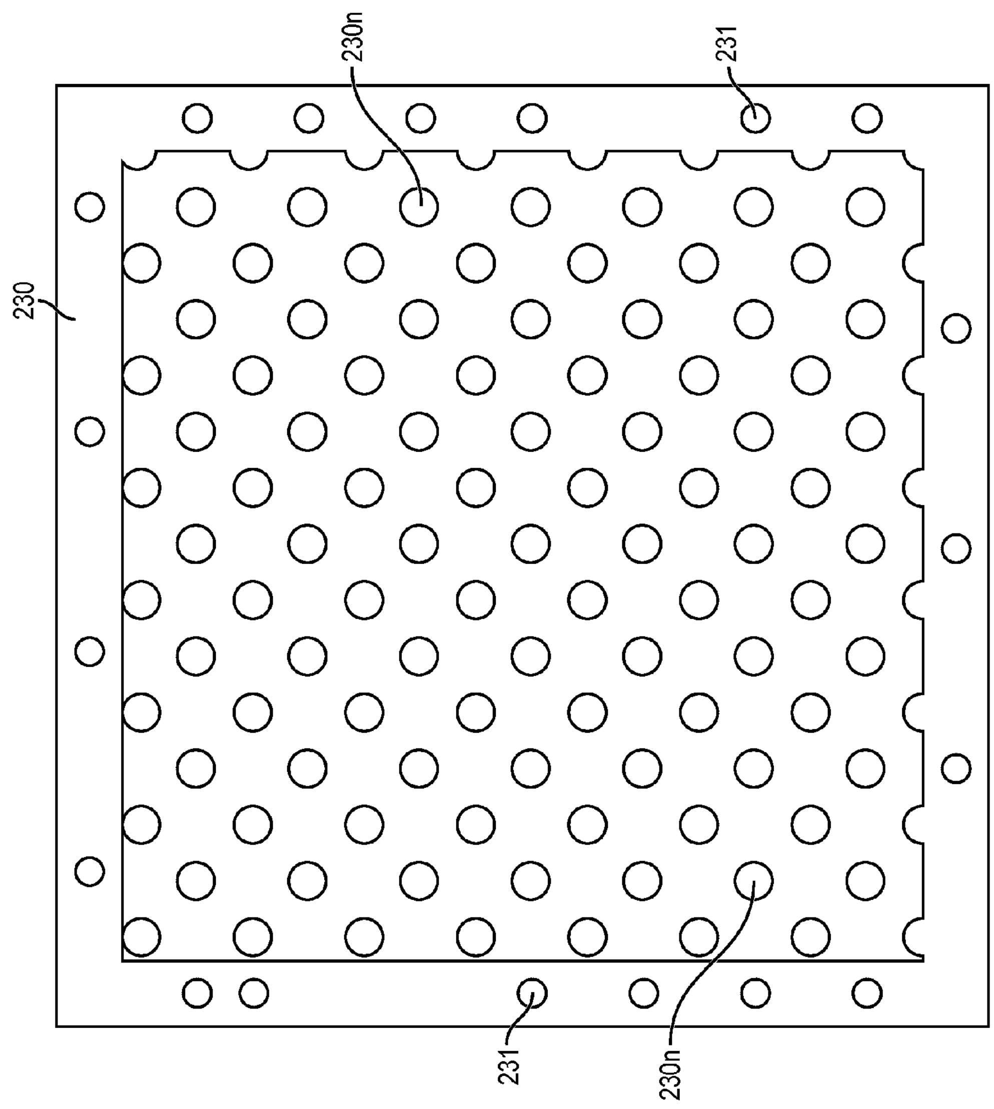

FIG. 5*g* shows a plan view of passivation layer 230. In one embodiment, optional windows or openings 231 are formed in passivation layer 230 around the perimeter of the semiconductor device and over encapsulant 226 to relieve stress. Passivation layer 230 extends beyond the edge of semiconductor die 194 at least 20 μm over encapsulant 226. Compliant islands 230*n* are formed as needed throughout a footprint of the semiconductor device.

Figure 5H:
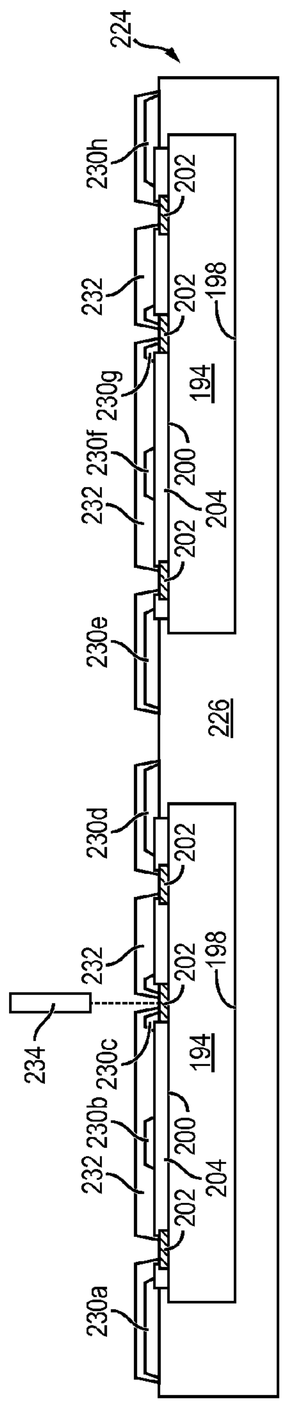

In FIG. 5*h*, an insulating or passivation layer 232 is formed over encapsulant 226, compliant islands 230*a*-230*h*, insulating layer 204, and conductive layer 202 using PVD, CVD, printing, spin coating, spray coating, sintering or thermal oxidation. Insulating layer 232 completely covers and surrounds a top surface and side surfaces of compliant islands 230*n*. Insulating layer 232 contains one or more layers of SiO2, Si3N4, SiON, Ta2O5, Al2O3, low temperature (<250° C.) curable polymer, or other material having similar structural and insulating properties. A portion of insulating layer 232 is removed by an exposure or development process, LDA using laser 234, etching, or other suitable method to expose conductive layer 202.

Figure 5I:
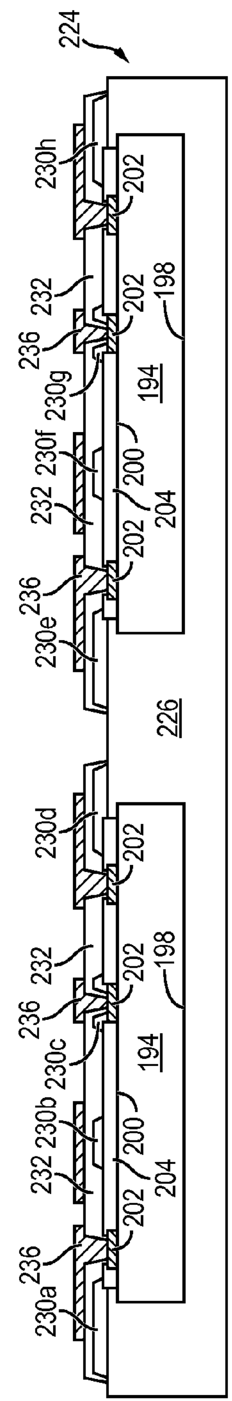

In FIG. 5*i*, an electrically conductive layer or RDL 236 is formed over insulating layer 232 using a patterning and metal deposition process such as sputtering, electrolytic plating, and electroless plating. Conductive layer 236 can be one or more layers of Al, Ti, titanium tungsten (TiW), Cu, Sn, Ni, Au, Ag, Tungsten (W), or other suitable electrically conductive material. One portion of conductive layer 236 is electrically connected to contact pads 202 of semiconductor die 194. Other portions of conductive layer 236 can be electrically common or electrically isolated depending on the design and function of semiconductor die 194. Some portions of conductive layer 236 are formed over compliant islands 230*n* to provide sites for interconnect structures to be formed as described below.

Figure 5J:
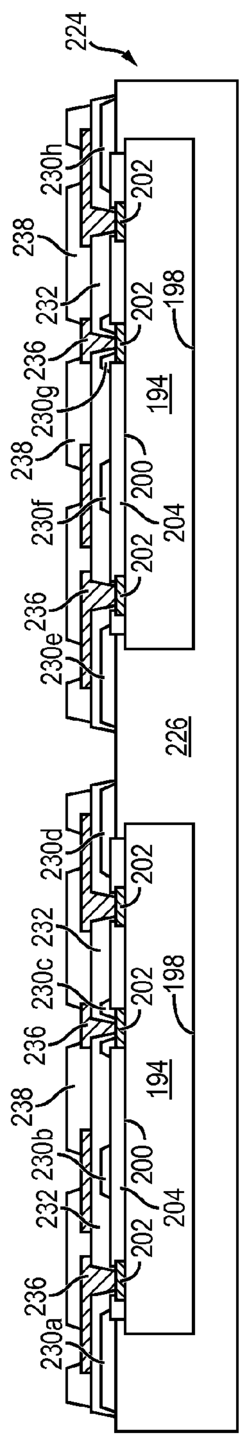

In FIG. 5*j*, an insulating or passivation layer 238 is formed over insulating layer 232 and conductive layer 236 using PVD, CVD, printing, slit coating, spin coating, spray coating, injection coating, lamination, sintering, or thermal oxidation. Insulating layer 238 contains one or more layers of SiO2, Si3N4, SiON, Ta2O5, Al2O3, polymer dielectric resist with or without fillers or fibers, low temperature (<250° C.) curable polymer photoresist, such as BCB, PBO, or epoxy based photosensitive polymer dielectric, or other material having similar structural and insulating properties. A portion of insulating layer 238 can be removed by an exposure or development process, LDA, etching, or other suitable process to expose conductive layer 236 over compliant island 230*n*.

Figure 5K:
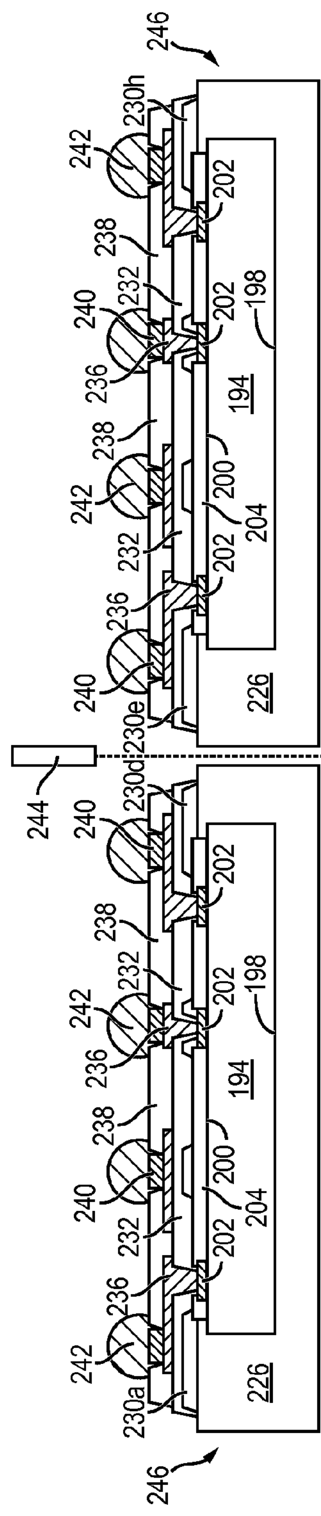

In FIG. 5*k*, an electrically conductive layer 240 is optionally formed over the exposed portion of conductive layer 236 and over insulating layer 238 after final repassivation using PVD, CVD, evaporation, electrolytic plating, electroless plating, or other suitable metal deposition process. Conductive layer 240 can be Al, Ti, TiW, Cu, Sn, Ni, Au, Ag, W, or other suitable electrically conductive material. Optional conductive layer 240 operates as an under bump metallization (UBM) electrically connected to conductive layer 236. UBM 240 can be a multi-metal stack with adhesion layer, barrier layer, and seed or wetting layer. The adhesion layer is formed over conductive layer 236 and can be titanium nitride (TiN), Ti, TiW, Al, or chromium (Cr). The barrier layer is formed over the adhesion layer and can be tantalum nitride (TaN), nickel vanadium (NiV), platinum (Pt), palladium (Pd), Ni, TiW, Ti, or chromium copper (CrCu). The barrier layer inhibits the diffusion of Cu into the active area of semiconductor die 194. The seed layer is formed over the barrier layer and can be Cu, Ni, NiV, Au, or Al. UBM 240 provides a low resistive interconnect to conductive layer 236, as well as a barrier to solder diffusion and seed layer for solder wettability. In one embodiment, the stress relieving properties of compliant islands 230*n* eliminate the need for UBM 240, allowing bumps 242 to be formed directly contacting conductive layer 236.

In FIG. 5*k*, an electrically conductive bump material is deposited over conductive layer 236, or optional UBM 240, using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 236 and optional UBM 240 using a suitable attachment or bonding process. In one embodiment, the bump material is reflowed by heating the material above its melting point to form balls or bumps 242. Each bump 242 is formed over a compliant island 230*n*. In some applications, bumps 242 are reflowed a second time to improve electrical contact to conductive layer 236 and optional UBM 240. Bumps 242 can also be compression bonded or thermocompression bonded to conductive layer 236 and optional UBM 240. Bumps 242 represent one type of interconnect structure that can be formed over conductive layer 236 and optional UBM 240. The interconnect structure can also use bond wires, conductive paste, stud bump, micro bump, or other electrical interconnect. An optional backgrinding step can be performed on reconstituted wafer 224 prior to singulation using methods that are well known in the art to planarize the surface of encapsulant 226 and expose back surface 198 of semiconductor die 194. In one embodiment, the back grinding process removes a portion of back surface 198 of semiconductor die 194. A chemical etch or CMP process can also be used to planarize encapsulant 226 and to remove mechanical damage resulting from the grinding operation. Reconstituted wafer 224 is singulated through encapsulant 226 with saw blade or laser cutting tool 244 into individual semiconductor packages, FO-WLCSPs 246.

Figure 6A:
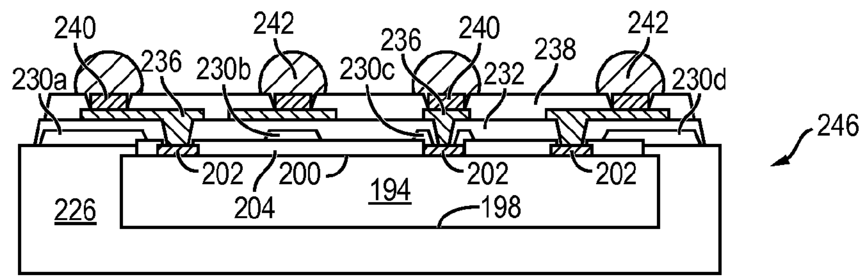
FIGS. 6*a*-6*d* illustrate alternative FO-WLCSPs with compliant islands.

FIG. 6*a* shows FO-WLCSP 246 from FIG. 5*k* after singulation. FO-WLCSP 246 includes semiconductor die 194 embedded in encapsulant 226. In FO-WLCSP 246 of FIG. 6*a*, semiconductor die 194 are electrically connected through contact pads 202, RDL 236, optional UBM 240, and bumps 242 to external electrical components. Each bump 242 is formed over a compliant island 230*n*. Insulating layer 230 contains one or more layers of SiO2, Si3N4, SiON, Ta2O5, Al2O3, low temperature (<250° C.) curable polymer, or other material having similar structural and insulating properties. Passivation layer 230 is coated over the fan-out substrate before insulating layer 232 to provide planarization at the interface between semiconductor die 194 and encapsulant 226. Passivation layer 230 helps prevent dishing of insulating layer 232 at the center of semiconductor die 194. Compliant islands 230*a* and 230*d* planarize the interface between the edge of semiconductor die 194 and encapsulant 226 to reduce standoff of semiconductor die 194. In one embodiment, compliant islands 230*a* and 230*d* extend beyond the edge of semiconductor die 194 at least 20 μm over encapsulant 226. Compliant islands 230*a* and 230*d* provide initial coverage over metal burrs and laser grooving recast to allow sufficient process margin and avoid shorting between metal layers formed near the edge of semiconductor die 194. Compliant islands 230*b* and 230*c* prevent dishing of insulating layer 232 at the center of semiconductor die 194. Compliant islands 230*a*-230*d*, generically, 230*n*, are positioned to provide compliant islands under bumps 242. In one embodiment, compliant islands 230*a*-230*d* are about 5 μm larger in diameter than UBM 240. In another embodiment, compliant islands 230*a*-230*d* are greater than 5 μm larger in diameter than UBM 240. A portion of compliant island 230*c* is removed by an exposure or development process, LDA using laser 228, etching, or other suitable method to expose conductive layer 202. Optional windows or openings 231 are formed in passivation layer 230 around the perimeter of FO-WLCSP 246 to relieve stress.

Figure 6B:
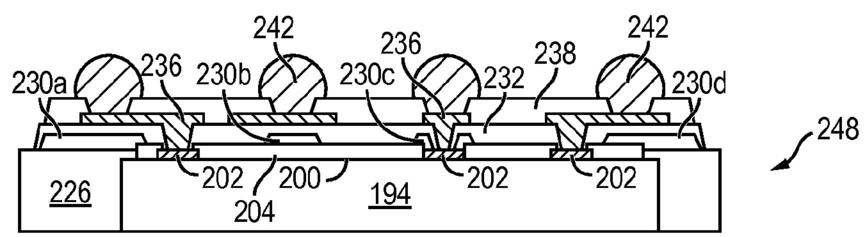

FIG. 6*b* shows FO-WLCSP 248, similar to FO-WLCSP 246 from FIG. 5*k*, but with optional backgrinding step prior to singulation. In FO-WLCSP 248, compliant islands 230*a*-230*d* increase reliability and eliminate the need for UBM 240. Bumps 242 of FO-WLCSP 248 contact conductive layer 236 directly. For purposes of illustration, FO-WLCSP 246 has been shown and described with UBM 240, and FO-WLCSP 248 has been shown and described without UBM 240. However, either FO-WLCSP 246 or FO-WLCSP 248 could be made with or without optional UBM 240. Each bump 242 is formed over a compliant island 230*n*. FO-WLCSP 248 includes semiconductor die 194 embedded in encapsulant 226. In FO-WLCSP 248 of 6*b*, semiconductor die 194 are electrically connected through contact pads 202, RDL 236, and bumps 242 to external electrical components. Insulating layer 230 contains one or more layers of SiO2, Si3N4, SiON, Ta2O5, Al2O3, low temperature (<250° C.) curable polymer, or other material having similar structural and insulating properties. Passivation layer 230 is coated over the fan-out substrate before insulating layer 232 to provide planarization at the interface between semiconductor die 194 and encapsulant 226. Passivation layer 230 helps prevent dishing of insulating layer 232 at the center of semiconductor die 194. Compliant islands 230*a* and 230*d* planarize the interface between the edge of semiconductor die 194 and encapsulant 226 to reduce standoff of semiconductor die 194. In one embodiment, compliant islands 230*a* and 230*d* extend beyond the edge of semiconductor die 194 at least 20 μm over encapsulant 226. Compliant islands 230*a* and 230*d* provide initial coverage over metal burrs and laser grooving recast to allow sufficient process margin and avoid shorting between metal layers formed near the edge of semiconductor die 194. Compliant islands 230*b* and 230*c* prevent dishing of insulating layer 232 at the center of semiconductor die 194. Compliant islands 230*a*-230*d* are positioned to provide compliant islands under bumps 242. In one embodiment, compliant islands 230*a*-230*d* are 5 μm larger in diameter than a typical UBM layer. A portion of compliant island 230*c* is removed by an exposure or development process, LDA using laser 228, etching, or other suitable method to expose conductive layer 202. Optional windows or openings 231 are formed in passivation layer 230 around the perimeter of FO-WLCSP 248 to relieve stress.

Figure 6C:
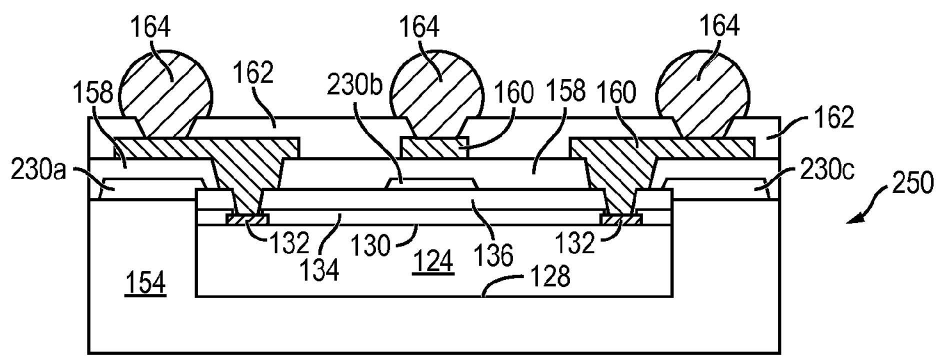

FIG. 6*c* shows FO-WLCSP 250, similar to FO-WLCSP 166 of FIG. 2*n*, but with compliant islands 230*a*-230*c*, generically, 230*n* formed between repassivation insulating layer 136 and insulating layer 158. Each bump 164 is formed over a compliant island 230*n*. In FO-WLCSP 250 of FIG. 6*c*, semiconductor die 124 is electrically connected through contact pads 132, RDL 160, and bumps 164 to external electrical components. The repassivation insulating layer 136 can be polymer dielectric material, such as polyimide, PBO, BCB, or repassivation inorganic dielectric, such as Si2n4, SiON, and SiO2. Vias 138 are formed through repassivation insulating layer 136 inside the footprint of contact pads 132. FO-WLCSP 250 uses vias 138 in repassivation insulating layer 136 to reduce the opening to contact pads 132 which improves alignment tolerance with RDL 160. In one embodiment, vias 138 are 20 μm in width or diameter, and at least 10 micrometers smaller than the opening of insulating layer 134, shown as dimension A in FIG. 2*o*. RDL 160*d* has a width or diameter of 60 μm, shown as dimension B in FIG. 2*o*. The RDL alignment tolerance is thus +20 μm with the 20 μm via 138 and 60 μm contact area for RDL 160*b* and 160*d*, which is within a typical die shift tolerance. In general, RDL 160 has at least 12 micrometer per side alignment tolerance with vias 138. The repassivation insulating layer 136 improve yield for FO-WLCSP 250 with lower cost since only lithography and thermal curing are needed. The repassivation insulating layer 136 also planarizes the surface of semiconductor die 124 for better adhesion to carrier 150 which reduces the potential shifting of semiconductor die 124. The insulating layer 136 has equal or better resolution as insulating layer 158. The repassivation insulating layer 136 can extend to saw street 126 to suppress cutting irregularities along the saw street, such as metal peeling, during wafer singulation. A double saw cut can be used instead of high cost laser cutting. Insulating layer 230 contains one or more layers of SiO2, Si3N4, SiON, Ta2O5, Al2O3, low temperature (<250° C.) curable polymer, or other material having similar structural and insulating properties. Passivation layer 230 is coated over the fan-out substrate before insulating layer 158 to provide planarization at the interface between semiconductor die 124 and encapsulant 154. Passivation layer 230 helps prevent dishing of insulating layer 158 at the center of semiconductor die 124. Compliant islands 230*a* and 230*c* planarize the interface between the edge of semiconductor die 124 and encapsulant 154 to reduce standoff of semiconductor die 124. In one embodiment, compliant islands 230*a* and 230*c* extend beyond the edge of semiconductor die 124 at least 20 μm over encapsulant 154. Compliant islands 230*a* and 230*c* provide initial coverage over metal burrs and laser grooving recast to allow sufficient process margin and avoid shorting between metal layers formed near the edge of semiconductor die 124. Compliant island 230*b* prevents dishing of insulating layer 158 at the center of semiconductor die 124. Compliant islands 230*a*-230*c* are positioned to provide compliant islands under bumps 164. In one embodiment, compliant islands 230*a*-230*c* are 5 μm larger in diameter than a typical UBM layer. Optional windows or openings 231 are formed in passivation layer 230 around the perimeter of FO-WLCSP 250 to relieve stress.

Figure 6D:
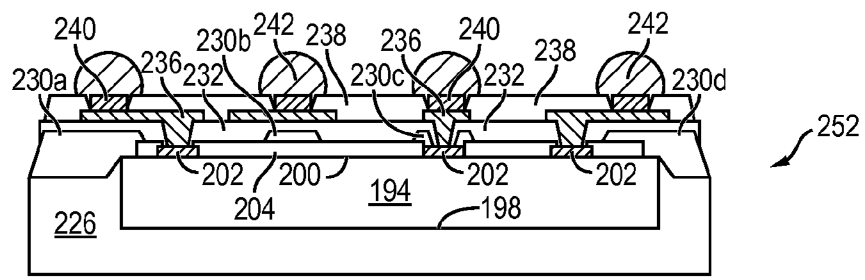

FIG. 6*d* shows FO-WLCSP 252, similar to FO-WLCSP 246, but with significant stand-off at the interface between encapsulant 226 and semiconductor die 194. FO-WLCSP 252 includes semiconductor die 194 embedded in encapsulant 226. In FO-WLCSP 252 of FIG. 6*d* semiconductor die 194 are electrically connected through contact pads 202, RDL 236, optional UBM 240, and bumps 242 to external electrical components. Each bump 242 is formed over a compliant island 230*n*. Insulating layer 230 contains one or more layers of SiO2, Si3N4, SiON, Ta2O5, Al2O3, low temperature (<250° C.) curable polymer, or other material having similar structural and insulating properties. Passivation layer 230 is coated over the fan-out substrate before insulating layer 232 to provide planarization at the interface between semiconductor die 194 and encapsulant 226. Passivation layer 230 helps prevent dishing of insulating layer 232 at the center of semiconductor die 194. Compliant islands 230*a* and 230*d* planarize the interface between the edge of semiconductor die 194 and encapsulant 226 to reduce standoff of semiconductor die 194. Compliant islands 230*a* and 230*d* are particularly helpful in mitigating the significant stand-off at the interface between the edge of semiconductor die 194 and encapsulant 226 of FO-WLCSP 252, as shown in FIG. 6*d*. In one embodiment, compliant islands 230*a* and 230*d* extend beyond the edge of semiconductor die 194 at least 20 μm over encapsulant 226. Compliant islands 230*a* and 230*d* provide initial coverage over metal burrs and laser grooving recast to allow sufficient process margin and avoid shorting between metal layers formed near the edge of semiconductor die 194. Compliant islands 230*b* and 230*c* prevent dishing of insulating layer 232 at the center of semiconductor die 194. Compliant islands 230*a*-230*d* are positioned to provide compliant islands under bumps 242. In one embodiment, compliant islands 230*a*-230*d* are 5 μm larger in diameter than optional UBM 240. A portion of compliant island 230*c* is removed by an exposure or development process, LDA using laser 228, etching, or other suitable method to expose conductive layer 202. Optional windows or openings 231 are formed in passivation layer 230 around the perimeter of FO-WLCSP 252 to relieve stress.

FIGS. 7*a*-7*e* illustrate, in relation to FIGS. 1 and 5*a*-5*k*, a process of forming a multi-die semiconductor package including a dielectric layer to provide both planarization at the interface between the semiconductor die and the encapsulant edge and compliant islands underneath the metal bump pads and the bumps. Continuing with the structure described in FIG. 5*e*, portions of passivation layer 230 are removed by an exposure or development process, LDA using laser 228, etching, or other suitable method to form compliant islands 230*a*-230*g*, generically, 230*n*. Compliant islands 230*a*, 230*d*, and 230*g* planarize the interface between the edge of semiconductor die 194 and encapsulant 226 to reduce standoff of semiconductor die 194. In one embodiment, compliant islands 230*a*, 230*d*, and 230*g* extend beyond the edge of semiconductor die 194 at least 20 μm over encapsulant 226. Large compliant island 230*d* is disposed over first semiconductor die 194, second semiconductor die 194, and encapsulant 226 between first and second semiconductor die 194. Compliant islands 230*a*, 230*d*, and 230*g* provide initial coverage over metal burrs and laser grooving recast to allow sufficient process margin and avoid shorting between metal layers formed near the edge of semiconductor die 194. Compliant islands 230*b*, 230*c*, 230*e*, and 230*f* prevent dishing at the center of semiconductor die 194. Compliant islands 230*n* are positioned to provide compliant islands under bumps to be formed later, as described below. In one embodiment, compliant islands 230*n* are 5 μm larger in diameter than under bump metalization to be formed later, as described below. Portions of compliant islands 230*c* and 230*f* are removed by an exposure or development process, LDA using laser 228, etching, or other suitable method to expose conductive layer 202.

Figure 7A:
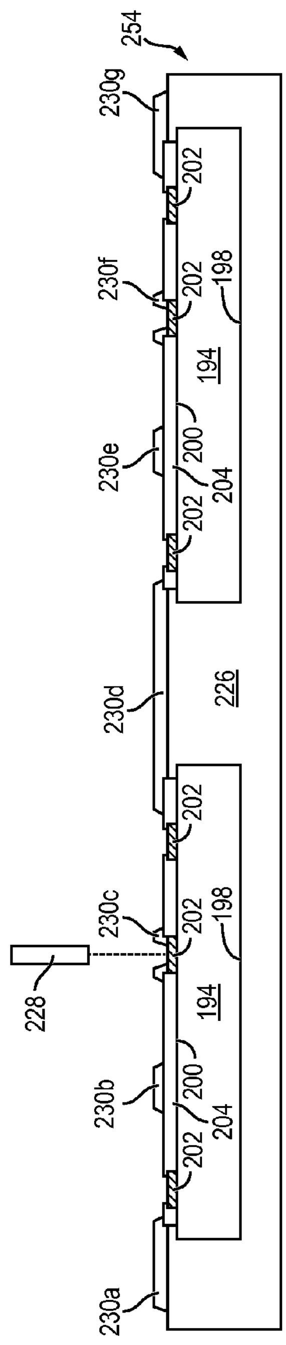
FIGS. 7*a*-7*e* illustrate an FO-WLCSP including two or more semiconductor die.
Figure 7B:
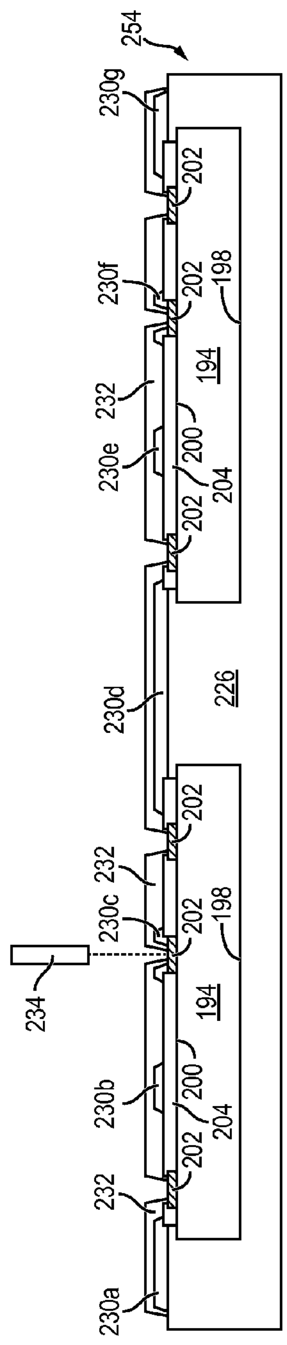

In FIG. 7*b*, an insulating or passivation layer 232 is formed over encapsulant 226, compliant islands 230*a*-230*g*, insulating layer 204, and conductive layer 202 using PVD, CVD, printing, spin coating, spray coating, sintering or thermal oxidation. Insulating layer 232 contains one or more layers of SiO2, Si3N4, SiON, Ta2O5, Al2O3, low temperature (<250° C.) curable polymer, or other material having similar structural and insulating properties. Insulating layer 232 completely covers and surrounds a top surface and side surfaces of compliant islands 230*n*. Portions of insulating layer 232 are removed by an exposure or development process, LDA using laser 234, etching, or other suitable method to expose conductive layer 202.

Figure 7C:
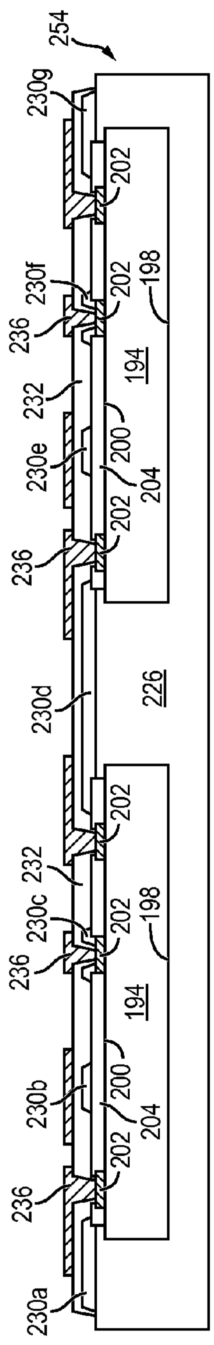

In FIG. 7*c*, an electrically conductive layer or RDL 236 is formed over insulating layer 232 using a patterning and metal deposition process such as sputtering, electrolytic plating, and electroless plating. Conductive layer 236 can be one or more layers of Al, Ti, TiW, Cu, Sn, Ni, Au, Ag, W, or other suitable electrically conductive material. One portion of conductive layer 236 is electrically connected to contact pads 202 of semiconductor die 194. Other portions of conductive layer 236 can be electrically common or electrically isolated depending on the design and function of semiconductor die 194. Some portions of conductive layer 236 are formed over compliant islands 230*n* to provide sites for interconnect structures to be formed as described below.

Figure 7D:
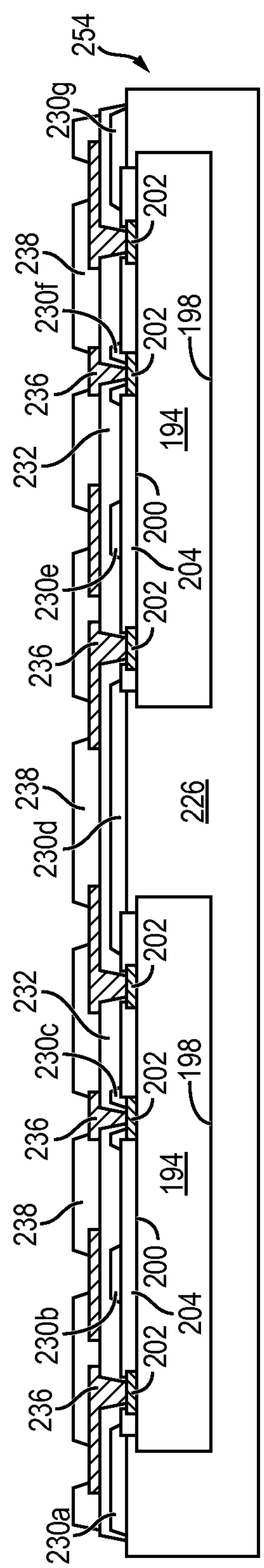

In FIG. 7*d*, an insulating or passivation layer 238 is formed over insulating layer 232 and conductive layer 236 using PVD, CVD, printing, slit coating, spin coating, spray coating, injection coating, lamination, sintering, or thermal oxidation. Insulating layer 238 contains one or more layers of SiO2, Si3N4, SiON, Ta2O5, Al2O3, polymer dielectric resist with or without fillers or fibers, low temperature (<250° C.) curable polymer photoresist, such as BCB, PBO, or epoxy based photosensitive polymer dielectric, or other material having similar structural and insulating properties. A portion of insulating layer 238 can be removed by an exposure or development process, LDA, etching, or other suitable process to expose conductive layer 236 over compliant island 230*n*.

Figure 7E:
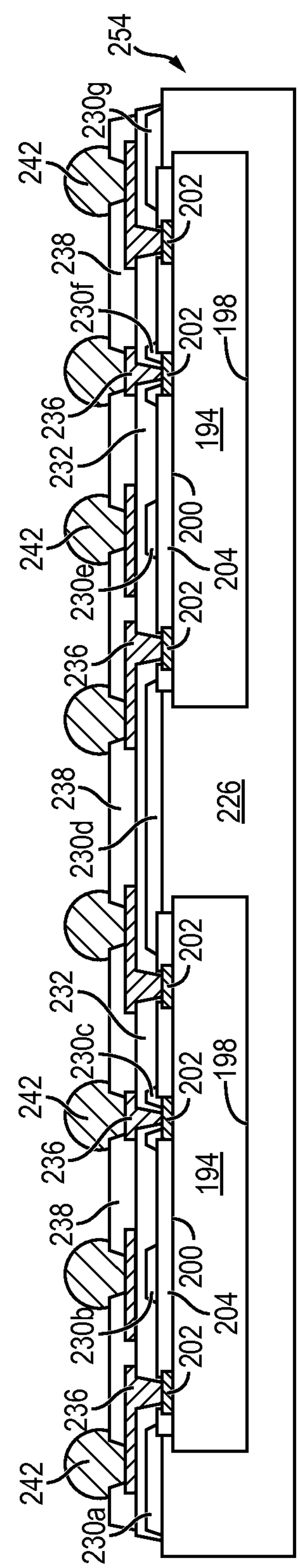

In FIG. 7*e*, an electrically conductive bump material is deposited over conductive layer 236, using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 236 using a suitable attachment or bonding process. In one embodiment, the bump material is reflowed by heating the material above its melting point to form balls or bumps 242. In some applications, bumps 242 are reflowed a second time to improve electrical contact to conductive layer 236. Bumps 242 can also be compression bonded or thermocompression bonded to conductive layer 236. Bumps 242 represent one type of interconnect structure that can be formed over conductive layer 236. The interconnect structure can also use bond wires, conductive paste, stud bump, micro bump, or other electrical interconnect. In one embodiment, bumps 242 are formed over optional UBM 240 as shown in FIG. 6*a*. Each bump 242 is formed over a compliant island 230*n*. Large compliant island 230*d* is disposed over first semiconductor die 194, second semiconductor die 194, and encapsulant 226 between first and second semiconductor die 194. Large compliant island 230*d* provides stress relieve for more than one bump 242. More than one bump 242 is formed over large compliant island 230*d*.

FIG. 7*e* shows FO-WLCSP 254. In one embodiment of FO-WLCSP 254, compliant islands 230*a*-230*g*, generically compliant island 230*n*, increase reliability and eliminate the need for UBM 240. Bumps 242 of FO-WLCSP 248 contact conductive layer 236 directly. For purposes of illustration, FO-WLCSP 246 has been shown and described with UBM 240, and FO-WLCSP 254 has been shown and described without UBM 240. However, either FO-WLCSP 246 or FO-WLCSP 254 could be made with or without optional UBM 240. Each bump 242 is formed over a compliant island 230*n*. FO-WLCSP 254 includes semiconductor die 194 embedded in encapsulant 226. In FO-WLCSP 254 of 7*e*, semiconductor die 194 are electrically connected through contact pads 202, RDL 236, and bumps 242 to external electrical components. Insulating layer 230 contains one or more layers of SiO2, Si3N4, SiON, Ta2O5, Al2O3, low temperature (<250° C.) curable polymer, or other material having similar structural and insulating properties. Passivation layer 230 is coated over the fan-out substrate before insulating layer 232 to provide planarization at the interface between semiconductor die 194 and encapsulant 226. Passivation layer 230 helps prevent dishing of insulating layer 232 at the center of semiconductor die 194. Compliant islands 230*a*, 230*d*, and 230*g* planarize the interface between the edge of semiconductor die 194 and encapsulant 226 to reduce standoff of semiconductor die 194. In one embodiment, compliant islands 230*a*, 230*d*, and 230*g* extend beyond the edge of semiconductor die 194 at least 20 μm over encapsulant 226. Compliant islands 230*a*, 230*d*, and 230*g* provide initial coverage over metal burrs and laser grooving recast to allow sufficient process margin and avoid shorting between metal layers formed near the edge of semiconductor die 194. Compliant islands 230*b*, 230*c*, 230*e*, and 230*f* prevent dishing of insulating layer 232 at the center of semiconductor die 194. Compliant islands 230*n* are positioned to provide a compliant island under each bump 242. Each bump 242 is formed over a compliant island 230*n*. Large compliant island 230*d* is disposed over first semiconductor die 194, second semiconductor die 194, and encapsulant 226 between first and second semiconductor die 194. Large compliant island 230*d* provides stress relief for more than one bump 242. More than one bump 242 is disposed over large compliant island 230*d*. In one embodiment, compliant islands 230*n* are 5 μm larger in diameter than a typical UBM layer. Portions of compliant islands 230*c* and 230*f* are removed by an exposure or development process, LDA using laser 228, etching, or other suitable method to expose conductive layer 202. Optional windows or openings 231 are formed in passivation layer 230 around the perimeter of FO-WLCSP 254 to relieve stress.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
- providing a first semiconductor die including a first conductive layer;
- forming a first insulating layer over the first semiconductor die and first conductive layer;
- disposing an encapsulant over the first semiconductor die opposite the first insulating layer;
- forming a second insulating layer over the encapsulant and first insulating layer;
- removing a portion of the second insulating layer to leave a first compliant island over the first conductive layer and a second compliant island extending outside a footprint of the first semiconductor die; and
- forming an interconnect structure over the first compliant island.

2. The method of claim 1, further including:
- forming an opening in the first compliant island over the first conductive layer; and
- forming a second conductive layer in the opening to couple the interconnect structure to the first conductive layer.

3. The method of claim 1, wherein the interconnect structure includes a bump.

4. The method of claim 1, further including forming an opening in the second insulating layer over the encapsulant for stress relief.

5. The method of claim 1, wherein the second insulating layer extends at least 20 μm outside the footprint of the first semiconductor die.

6. The method of claim 1, wherein:

disposing the encapsulant further includes disposing the encapsulant over a second semiconductor die disposed adjacent to the first semiconductor die; and removing the portion of the second insulating layer further includes leaving the second compliant island over the first and second semiconductor die and the encapsulant between the first and second semiconductor die.

7. A method of making a semiconductor device, comprising:

providing a first semiconductor die;

forming a first insulating layer over a first surface of the first semiconductor die;

disposing an encapsulant over a second surface of the first semiconductor die; and forming a compliant island over the first insulating layer.

8. The method of claim 7, further including forming an opening in the compliant island over a conductive layer formed over the first semiconductor die.

9. The method of claim 7, wherein forming the compliant island further includes:

forming a second insulating layer over the encapsulant and first insulating layer; and removing a portion of the second insulating layer to leave the compliant island.

10. The method of claim 9, further including forming an opening in the second insulating layer over the encapsulant for stress relief.

11. The method of claim 9, wherein the second insulating layer extends beyond an edge of the first semiconductor die at least 20 μm over the encapsulant.

12. The method of claim 7, wherein:

disposing the encapsulant further includes disposing the encapsulant over a second semiconductor die disposed adjacent to the first semiconductor die; and forming the compliant island further includes forming the compliant island over the first and second semiconductor die and the encapsulant between the first and second semiconductor die.

13. The method of claim 12, further including forming a plurality of interconnect structures over the compliant island.

14. A semiconductor device, comprising:

a semiconductor die including a conductive layer;

a first insulating layer formed over the semiconductor die and conductive layer;

an encapsulant disposed over the semiconductor die;

a compliant island formed over the conductive layer; and an interconnect structure formed over the compliant island.

15. The semiconductor device of claim 14, further including an under bump metalization (UBM) formed over the compliant island, wherein the compliant island includes a diameter greater than 5 μm larger than a diameter of the UBM.

16. The semiconductor device of claim 14, further including an opening formed in the compliant island over the conductive layer.

17. The semiconductor device of claim 14, further including a second insulating layer formed over the first insulating layer and compliant island.

18. The semiconductor device of claim 14, further including a second insulating layer formed over an interface between the semiconductor die and the encapsulant with an opening formed in the second insulating layer over the encapsulant for stress relief.

19. The semiconductor device of claim 18, wherein the second insulating layer extends beyond an edge of the semiconductor die at least 20 μm over the encapsulant.

20. A semiconductor device, comprising:

a semiconductor die;

a compliant island formed over the semiconductor die; and a first insulating layer including a first surface that is substantially planar over a width of the compliant island.

21. The semiconductor device of claim 20, further including a second insulating layer formed between the semiconductor die and first insulating layer.

22. The semiconductor device of claim 20, further including an under bump metalization (UBM) formed over the compliant island, wherein the compliant island includes a diameter greater than 5 μm larger than a diameter of the UBM.

23. The semiconductor device of claim 20, further including:

a conductive layer formed over the semiconductor die; and an opening formed in the compliant island over the conductive layer.

24. The semiconductor device of claim 20, further including:

an encapsulant deposited over the semiconductor die; and a second insulating layer formed over an interface between the semiconductor die and the encapsulant.

25. The semiconductor device of claim 24, wherein the second insulating layer extends beyond an edge of the semiconductor die at least 20 μm outside a footprint of the semiconductor die.

* * * * *